US010714411B2

(12) United States Patent  
Sauter et al.

(10) Patent No.: US 10,714,411 B2  
(45) Date of Patent: Jul. 14, 2020

(54) INTERCONNECTED INTEGRATED CIRCUIT (IC) CHIP STRUCTURE AND PACKAGING AND METHOD OF FORMING SAME

(71) Applicant: GLOBALFOUNDRIES INC., Grand Cayman (KY)

(72) Inventors: Wolfgang Sauter, Burke, VT (US); Mark W. Kuemerle, Essex Junction, VT (US); Eric W. Tremble, Jericho, VT (US); David B. Stone, Jericho, VT (US); Nicholas A. Polomoff, Irvine, CA (US); Eric S. Parent, Saratoga Springs, NY (US); Jawahar P. Nayak, Clifton Park, NY (US); Seungman Choi, Loudonville, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/921,852

(22) Filed: Mar. 15, 2018

(65) Prior Publication Data

US 2019/0287879 A1   Sep. 19, 2019

(51) Int. Cl.
*H01L 23/48* (2006.01)
*H01L 23/488* (2006.01)
*H01L 25/065* (2006.01)

(52) U.S. Cl.
CPC ........ *H01L 23/488* (2013.01); *H01L 25/0657* (2013.01); *H01L 2224/04105* (2013.01); *H01L 2224/13026* (2013.01); *H01L 2924/15331* (2013.01); *H01L 2924/3512* (2013.01)

(58) Field of Classification Search
CPC .......................... H01L 23/488; H01L 25/0657
See application file for complete search history.

(56) References Cited

U.S. PATENT DOCUMENTS

| 6,002,178 | A  | 12/1999 | Lin |
| 6,953,956 | B2 | 10/2005 | Or-Bach et al. |
| 7,105,871 | B2 | 9/2006  | Or-Bach et al. |
| 8,513,787 | B2 | 8/2013  | Williams et al. |
| 8,823,172 | B2 | 9/2014  | Lim et al. |
| 9,502,345 | B2 | 11/2016 | Youn et al. |

(Continued)

FOREIGN PATENT DOCUMENTS

JP         2012089904 A    5/2012

*Primary Examiner* — Hoa B Trinh  
(74) *Attorney, Agent, or Firm* — Athony Canale; Hoffman Warnick LLC

(57) ABSTRACT

An IC chip structure including a plurality of IC chips electrically connected to one another in back-end-of-line (BEOL) interconnect layer of the structure is disclosed. The IC structure may include openings in crack-stop structures surrounding the IC chips and a interconnect wire extending between the IC chips through the openings. A packaging structure for utilizing the IC structure where at least one IC chip is inoperable is also disclosed. The structure may include a first bond pad array on a top surface of a packaging substrate including operable bond pads connected to an operable IC chip and structural support bond pads connected to the inoperable IC chip; a second bond pad array on a bottom surface of the substrate including operable bond pads connected to a single IC chip printed circuit board; and an interconnect structure for connecting the operable bond pads of the first and second bond pad arrays.

19 Claims, 23 Drawing Sheets

(56) References Cited

U.S. PATENT DOCUMENTS

| | | |
|---|---|---|
| 9,865,574 B2 | 1/2018 | Huang et al. |
| 2008/0296571 A1 | 12/2008 | Cheng et al. |
| 2012/0088329 A1 | 4/2012 | Ken |
| 2012/0146205 A1 | 6/2012 | Fernando et al. |
| 2014/0191403 A1 | 7/2014 | Barber |
| 2015/0351234 A1* | 12/2015 | Seguido ............... H05K 1/0296 361/773 |

* cited by examiner

INTERCONNECTED INTEGRATED CIRCUIT (IC) CHIP STRUCTURE AND PACKAGING AND METHOD OF FORMING SAME

BACKGROUND

The present disclosure relates to integrated circuit (IC) fabrication, and more specifically, to interconnected integrated circuit (IC) chip structures and packaging for the same.

Integrated circuit (IC) chips can include billions of interconnected devices, such as transistors, resistors, capacitors, and diodes, etc., located in layers of material. Multiple IC chips may be interconnected to form multi-chip modules (MCMs) for electronic devices such as computers, mobile devices and gaming systems.

One challenge associated with the fabrication of MCMs includes difficulties with interconnecting the IC chips of the MCM. Interconnecting IC chips during the IC chip fabrication process may be difficult as a result of impenetrable structures, such as crack-stops, that surround and protect the IC components for each IC chip. One solution for interconnecting multiple IC chips includes using a series of packaging interconnects to connect the IC chips after fabrication and dicing. Challenges associated with packaging and/or assembly based interconnection of IC chips include limitations on minimum package size, limitations on the number of chips that may be interconnected, and quality of communication between the IC chips. Another challenge may include addressing limitations on IC chip size and compatibility of chips of different sizes for interconnection.

SUMMARY

A first aspect of the disclosure is directed to a structure including: a packaging substrate including a top surface and a bottom surface; a first bond pad array on the top surface of the packaging substrate, the first bond pad array including: a set of operable bond pads, and a set of structural support bond pads adjacent to the set of operable bond pads, wherein the structural support bond pads are electrical opens; a second bond pad array on the bottom surface of the packaging substrate, the second bond pad array including: a set of operable bond pads, and a set of structural bond pads adjacent to the set of operable bond pads; a plurality of interconnected integrated circuit (IC) chips positioned on the first bond pad array, the plurality of interconnected IC chips including: an operable integrated circuit (IC) chip connected to the set of operable bond pads of the first bond pad array, and an inoperable integrated circuit (IC) chip interconnected with the operable IC chip, the inoperable IC chip of the plurality of interconnected IC chips connected to the set of structural support bond pads of the first bond pad array; and an interconnect structure positioned within the packaging substrate, wherein the interconnect structure electrically connects the set of operable bond pads of the first bond pad array to the set of operable bond pads of the second bond pad array.

A second aspect of the disclosure includes a structure including: a packaging substrate including a top surface and a bottom surface; a first bond pad array on the top surface of the packaging substrate, the first bond pad array including: a set of operable bond pads configured to electrically connect to an operable integrated circuit (IC) chip of a plurality of interconnected integrated circuit (IC) chips, and a set of structural support bond pads adjacent to the set of operable bond pads configured to connect to an inoperable integrated circuit (IC) chip of the plurality of interconnected IC chips, wherein the set of structural support bond pads are electrical opens; a second bond pad array on the bottom surface of the packaging substrate, the second bond pad array including: a set of operable bond pads configured to electrically connect the operable integrated IC chip to a printed circuit board (PCB) for a single integrated circuit (IC) chip device, and a set of structural support bond pads adjacent to the set of operable bond pads; and an interconnect structure positioned within the packaging substrate, wherein the interconnect structure electrically connects the set of operable bond pads of the first bond pad array to the set of operable bond pads of the second bond pad array.

A third aspect of the disclosure is related to interconnected integrated circuit (IC) chips including: a semiconductor substrate; a device layer positioned on the semiconductor substrate, the device layer including; a first set of devices for a first IC chip; a second set of devices for a second IC chip, the second set of devices adjacent to the first set of devices; a back end of line (BEOL) region positioned above the device layer; a first crack-stop structure extending vertically through both the device layer and the BEOL region, the first crack-stop structure surrounding the first set of devices; a second crack-stop structure extending vertically through both the device layer and the BEOL region, the second crack-stop structure surrounding the second set of devices; a first opening in the first crack-stop structure within the BEOL region; a second opening in the second crack-stop structure within the BEOL region; and a connector wire within the BEOL region, the connector wire electrically connecting the first IC chip to the second IC chip through the first opening and the second opening.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
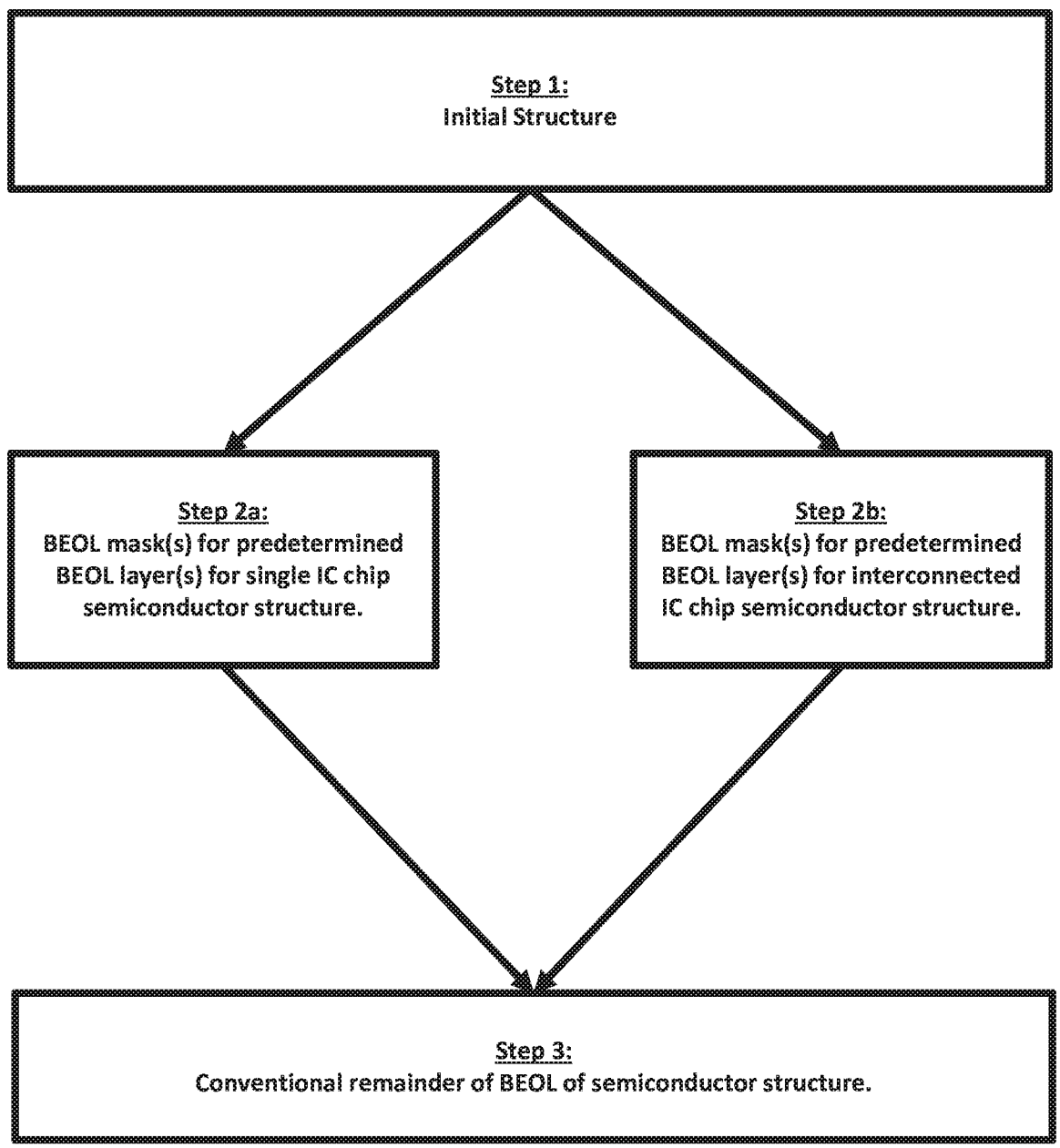
FIG. 1 shows a method for forming a semiconductor structure, according to embodiments of the disclosure.

In the following description, reference is made to the accompanying drawings that form a part thereof, and in which is shown by way of illustration specific embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely illustrative.

Embodiments of the present disclosure provide a method for forming a BEOL structure for either single integrated circuit (IC) chips or a number of interconnected IC chips (e.g., for a multi-chip module (MCM)) using the same or similar fabrication process scheme. The method may include interchanging a set of masks at a predetermined BEOL layer or layers to allow for a BEOL structure for either single IC chips or multiple interconnected IC chips to be formed from the same initial structure. As used herein, the term "BEOL" may include operations performed on the semiconductor wafer in the course of device manufacturing following first metallization. As used herein, the term "BEOL layer" may include a layer formed on the semiconductor wafer in the course of device manufacturing following first metallization. According to embodiments of the disclosure, one mask for a predetermined BEOL layer may include crack-stop pattern openings for a crack-stop that completely surrounds semiconductor devices therebelow for a single IC chip scheme. Another mask, interchangeable with the first mask at the same predetermined BEOL layer, may include crack-stop pattern openings including openings in the crack-stop for interconnect structures to extend therethrough for interconnecting multiple IC chips. Embodiments of the disclosure may allow for IC chips to be interconnected to one another during formation of the BEOL structure (i.e., during BEOL processing) instead of during packaging. Embodiments of the present disclosure may reduce the time, cost and complexity associated with semiconductor chips having different layouts depending on whether single IC chips or interconnected IC chips are desired. Additionally, embodiments of the present disclosure may allow for BEOL structure layouts to become more customizable. Embodiments of the present disclosure may also, for example, improve the bandwidth for chip to chip communications and improve the performance of structures having interconnected IC chips.

As an initial matter, in order to clearly describe the current disclosure it will become necessary to select certain terminology when referring to and describing structures of the integrated circuit (IC) structure(s) herein. When doing this, if possible, common industry terminology will be used and employed in a manner consistent with its accepted meaning. Unless otherwise stated, such terminology should be given a broad interpretation consistent with the context of the present application and the scope of the appended claims. Those of ordinary skill in the art will appreciate that often a particular component may be referred to using several different or overlapping terms.

"Predetermined BEOL layer" may include any desirable layer, via or metal, within the BEOL of a structure that may be selected to include a set of interchangeable masks for forming different layouts of that layer depending on whether a structure for singe IC chips or multiple interconnected IC chips is desired. "Single IC chip" may include separate, individual IC chips that result after dicing of a semiconductor wafer. "IC chip region" may include a set of semiconductor devices surrounded by its own crack-stop structure and that may otherwise be diced around its crack-stop structure to form a single IC chip. "Set of Interconnected IC chips" may include a plurality of IC chips that remain physically connected on a semiconductor substrate after dicing of a semiconductor wafer, and that include at least one interconnect wire extending between the plurality of IC chips in the BEOL of the structure. "Multi-chip module (MCM)" may include two or more single IC chips formed after dicing of the semiconductor wafer that are electrically connected during assembly or packaging of the IC chips.

Turning to the drawings, as shown in FIG. 1, an example method for forming structures for IC chips according to embodiments of the disclosure discussed above is shown. The method may include a first step, step 1, of forming an initial structure such as, for example, initial structure 102 of FIG. 2, described hereafter. The initial structure may be used to form a structure for forming either single IC chips or interconnected IC chips using the processes described here with respect to the method of FIG. 1.

Figure 2:
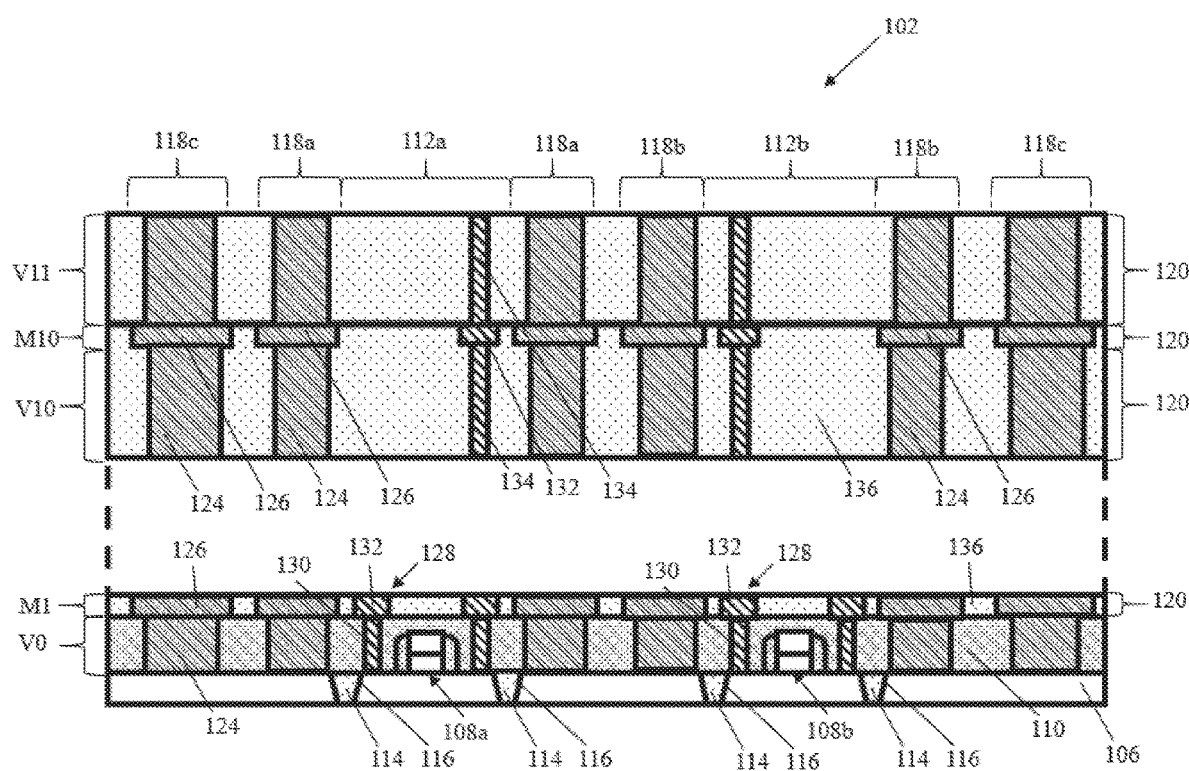
FIG. 2 shows a cross-sectional view an initial structure, according to embodiments of the disclosure.

FIG. 2 shows a perspective view of example initial structure 102, according to embodiments of the disclosure. As shown in FIG. 2, initial structure 102 may include a device layer or initial via layer V0 positioned on a semiconductor substrate 106. Substrate 106 may be formed using any now known or later developed semiconductor fabrication techniques and materials for forming a substrate. Substrate 106 may include but is not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of each layer may be strained. Although not shown, substrate 106 may alternatively include a silicon-on-insulator (SOI) substrate formed by any now known or later developed semiconductor techniques for forming an SOI substrate.

Initial via layer V0 may be formed on substrate 106 to cover various semiconductor devices (e.g., transistors 108a, 108b) for one or more IC chips. Initial via layer V0 may include an interlayer dielectric (ILD) 110 for electrically insulating semiconductor devices formed therein, and any variety of contacts to the semiconductor devices. ILD 110 may be formed by any now known or later developed semiconductor fabrication techniques and materials for forming an ILD. For example, ILD 110 may be formed by depositing silicon nitride on substrate 106, patterning and etching via openings, depositing a conductor(s) in the openings and planarizing.

As also shown in FIG. 2, initial via layer V0 may include semiconductor devices such as transistors 108a, 108b formed prior to ILD 110 of initial via layer V0. For example, transistor 108a may be formed within a first IC chip region 112a, and transistor 108b may be formed within a second IC chip region 112b. While a certain type of transistor 108a,b, e.g., planar, has been shown, it is recognized that the transistors can take any form, e.g., finFETs, vertical FETs, etc. Although two transistors 108a, 108b are shown in FIG. 2, it is understood that initial via layer V0 may include any desirable number and type of semiconductor devices for any number of IC chips. It should also be understood that although initial structure 102 is shown in the example of FIG. 2 as including two IC chip regions 112a,b including a particular layout, size, set and number of structures, etc., initial structure 102 may include any number of IC chip regions including any layout, size, set and number of structures, etc. Transistors 108a, 108b and any other semiconductor devices formed under ILD 110 of initial via layer V0 may be formed by any now known or later developed semiconductor fabrication techniques and materials for forming semiconductor devices of an IC chip.

As further shown in FIG. 2, initial structure 102 may include shallow trench isolations (STI) 114 positioned within substrate 106 for electrically isolating semiconductor devices (e.g., transistors 108a, 108b) in ILD 110 of initial via layer V0. STIs 114 may be formed by any now known or later developed semiconductor fabrication techniques and materials for forming an STI. For example, STIs 114 may be formed by creating trenches 116 in substrate 106, forming a liner (not shown for purposes of simplicity) within trenches 116, and filing the trenches with an insulator material such as silicon oxide.

As also shown in FIG. 2, initial via layer V0 may further include interconnect vias 130 for electrically connecting the semiconductor devices (e.g., transistors 108a, 108b) of initial via layer V0 to back-end-of-line (BEOL) interconnect layers for electrical connection with other components of the semiconductor structure. Interconnect vias 130 may be formed within ILD 110 of initial via layer V0. Interconnect structures 128 may include interconnect vias 130 in initial via layer V0, and metal wires 132 above the vias in ILD 110 in a first metal layer M1 of BEOL layers above initial via layer V0. Interconnect vias 130 may be formed by any now known or later developed semiconductor fabrication techniques and materials for forming interconnect structures. Although four interconnect vias are shown, it is understood that any desirable number of interconnect vias may be formed in initial via layer V0.

As also shown in FIG. 2, initial structure 102 may include one or more back-end-of-line (BEOL) layers 120 (e.g., via layers and metal layers) positioned above initial via layer V0. The broken lines between initial via layer V0 and V11 of FIG. 2 may represent the BEOL layers therebetween but not shown for purposes of simplicity. As discussed above, in contrast to conventional semiconductor fabrication techniques, embodiments of the disclosure may allow for a BEOL structure for either single IC chips or multiple interconnected IC chips to be formed from the same initial structure, e.g., initial structure 102. As also discussed above, embodiments of the disclosure may include interchanging masks at one or more predetermined BEOL layers based on whether BEOL structures for single IC chips or multiple interconnected IC chips are desired. The predetermined BEOL layer or layers at which masks may be interchanged according to embodiments of the disclosure may vary based on the application of the structure being formed. Therefore, initial structure 102 may include any number of BEOL layers 120, up until the first predetermined BEOL layer at which masks are interchanged. In non-limiting examples, the predetermined BEOL layer or layers may include the M5 or M6 layer, the M11 layer, the V11 layer, the M11 layer or the V12 layer, among others.

BEOL layers 120 of initial structure 102 may include stacked, alternating via layers (e.g., via layers V10, V11) and metal layers (the examples shown are metal layers M1, M10). The metal layers may include metal wires 132 (shown only for M1) for interconnecting structures, and the via layers may include vias 134 for interconnecting structures. Although shown to include up to via layer V11 in FIG. 2, initial structure 102 may include any number of BEOL layers based on the predetermined BEOL layer(s) and the overall number of BEOL layers for the structure for the IC chips. Additionally, although the final BEOL layer of initial structure 102 is shown as a via layer, the final BEOL layer of the initial structure may alternatively include a metal BEOL layer.

Figure 6:
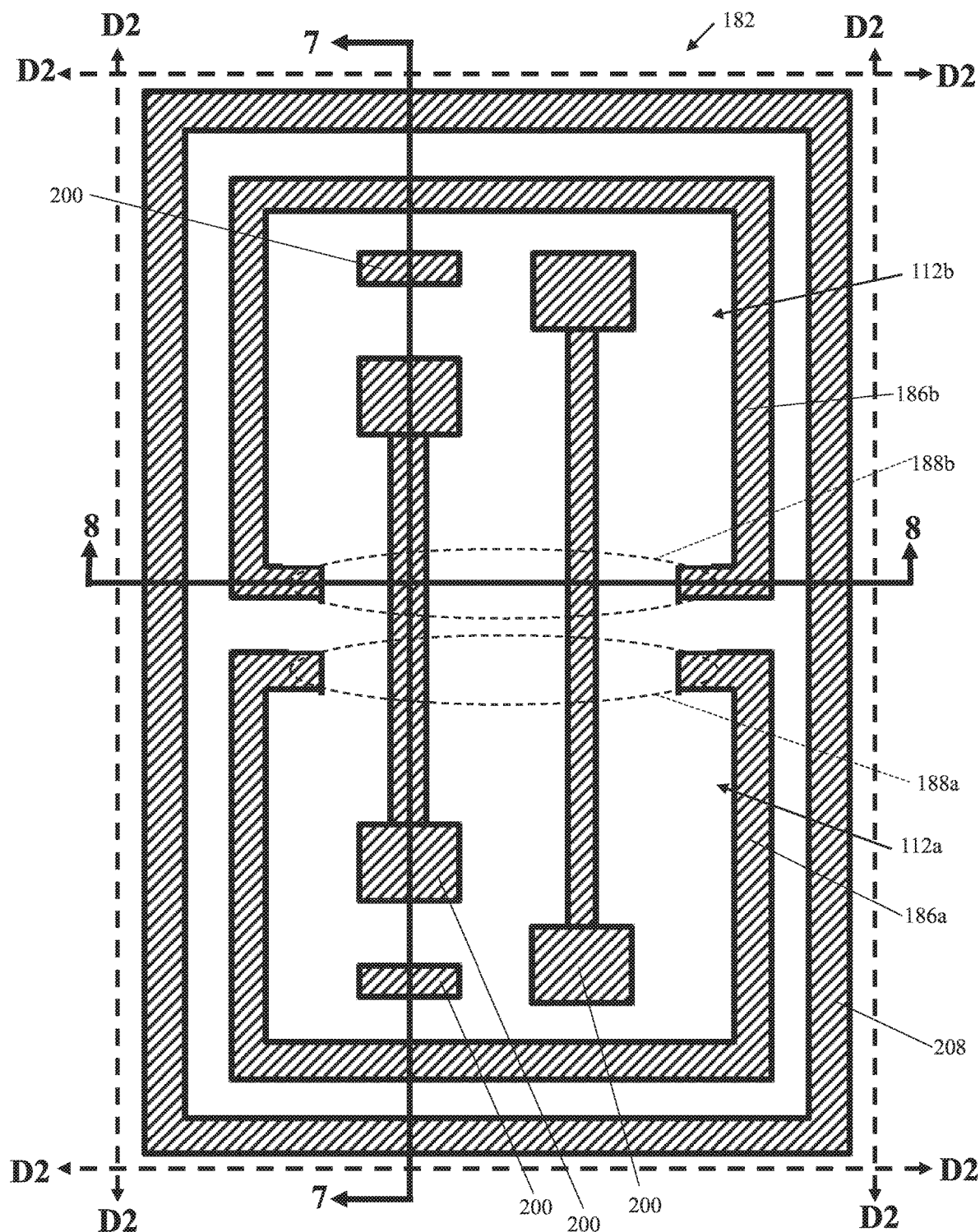
FIG. 6 shows a plan view of another mask for forming a BEOL layer on the initial structure of FIG. 2, according to embodiments of the disclosure.

Initial via layer V0 and the BEOL layers of initial structure 102 may also each include portions of crack-stop structures 118a, 118b, 118c to prevent delamination of the layers of the semiconductor structure and protect semiconductor devices within the metal and via layers during subsequent processing (e.g., dicing) of the semiconductor wafer. As used herein, a crack-stop may include a wall-like structure that extends into and out of the page of FIG. 2 through multiple metal and via layers and wraps around IC chip regions to protect structures formed therein. For example, as best shown by crack-stop pattern openings 156a,b in BEOL layer mask 152 of FIG. 3, the crack-stop structure may include metal structures that surround other structures (e.g., interconnect structures, semiconductor devices such as transistors 108a,b, etc.) in each IC chip region. As shown in FIG. 2, the via layers (shown as initial via layer V0, and via layers V10 and V11) may include via layer portions 124 of the crack-stop structures. The metal layers (shown as metal layers M1 and M10) may include metal layer portions 126 of the crack-stop structures. Portions 124 and 126 of crack-stop structure 118a may surround transistor 108a along the perimeter of first IC chip region 112a; portions 124 and 126 of crack-stop structure 118b may surround transistor 108b around the perimeter of second IC chip region 112b; and portions 124 and 126 of crack-stop structure 118c may surround transistors 108a, 108b, and the portions of crack-stop structure 118a,b. Crack-stop structure 118c may be optionally formed, for example, for protecting structures of set of interconnected IC chips. For example, as best shown in FIG. 6, crack-stop pattern opening 208 of BEOL layer mask 182 may surround the crack-stops for both first IC chip region 112a and second IC chip region 112b such that a crack-stop formed using opening 208 protects structures within crack-stop pattern opening 208 during dicing along dicing lines D2. Portions 124 and 126 of crack-stop structures 118a,b,c may be formed by any now known or later developed processes and materials for forming crack-stops. Crack-stop portions 124 and 126 may include a liner (not shown for purposes of simplicity) and although one via layer portion 124 is shown in the example of FIG. 2, crack-stop structures 118a, 118b, 118c may each include any number of via layer portions 124 within each via layer as may be desirable for the crack-stop structure.

Figure 3:
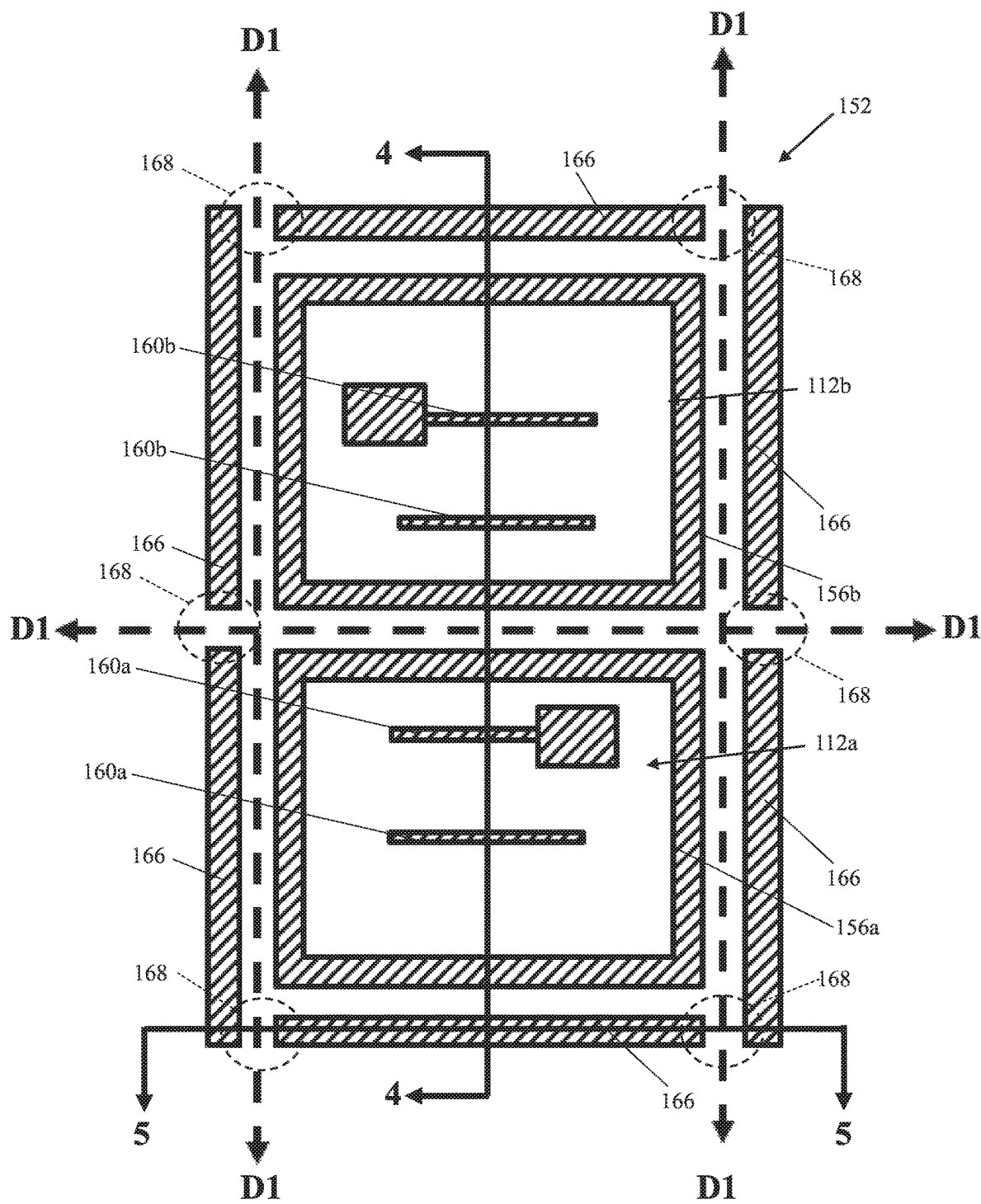
FIG. 3 shows a plan view of a mask for forming a back-end-of-line (BEOL) layer on the initial structure of FIG. 2, according to embodiments of the disclosure.
Figure 4:
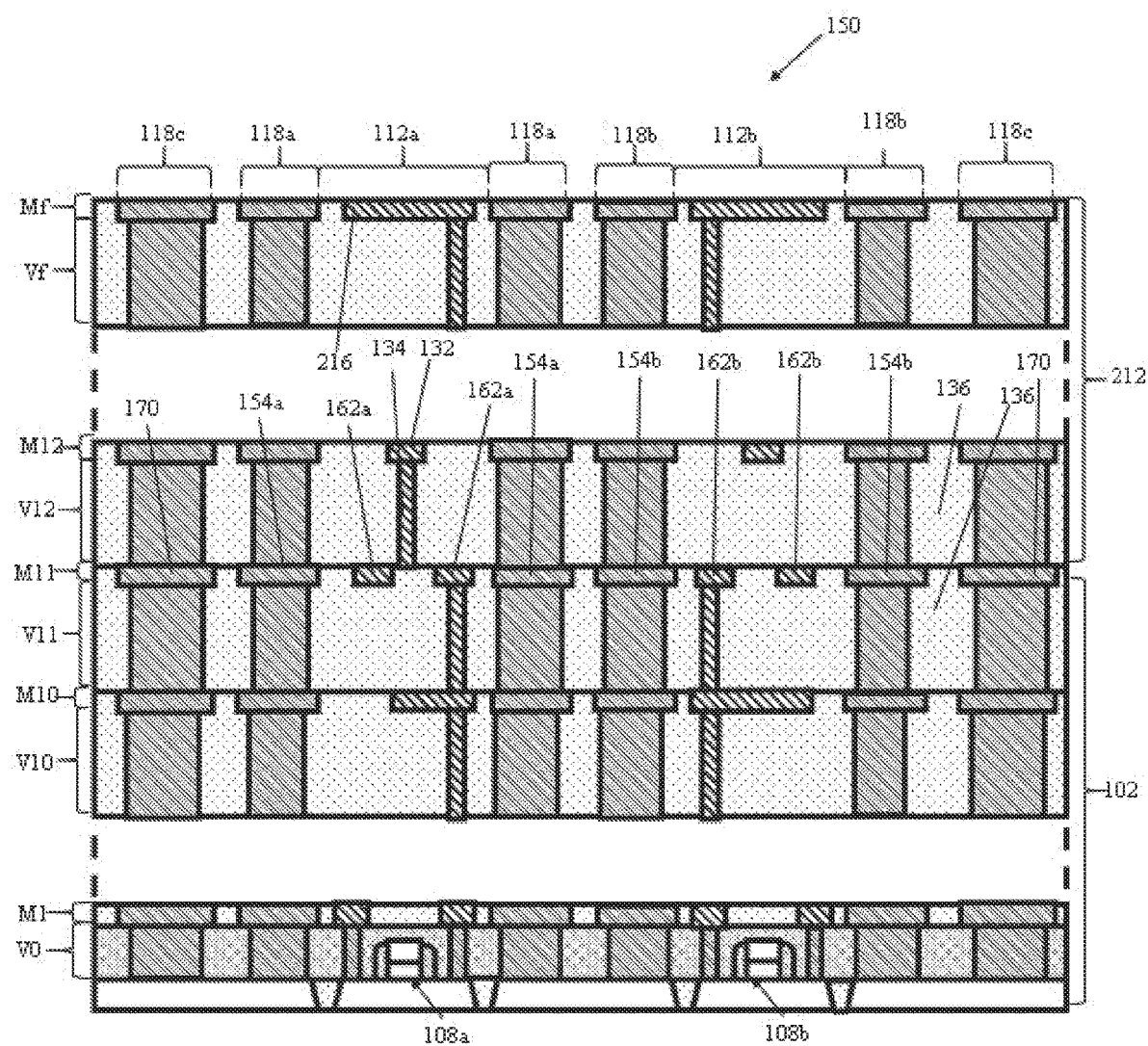
FIG. 4 shows a cross-sectional view of forming a BEOL layer on the initial structure of FIG. 2 using the mask of FIG. 3 at line 4-4, according to embodiments of the disclosure.
Figure 5:
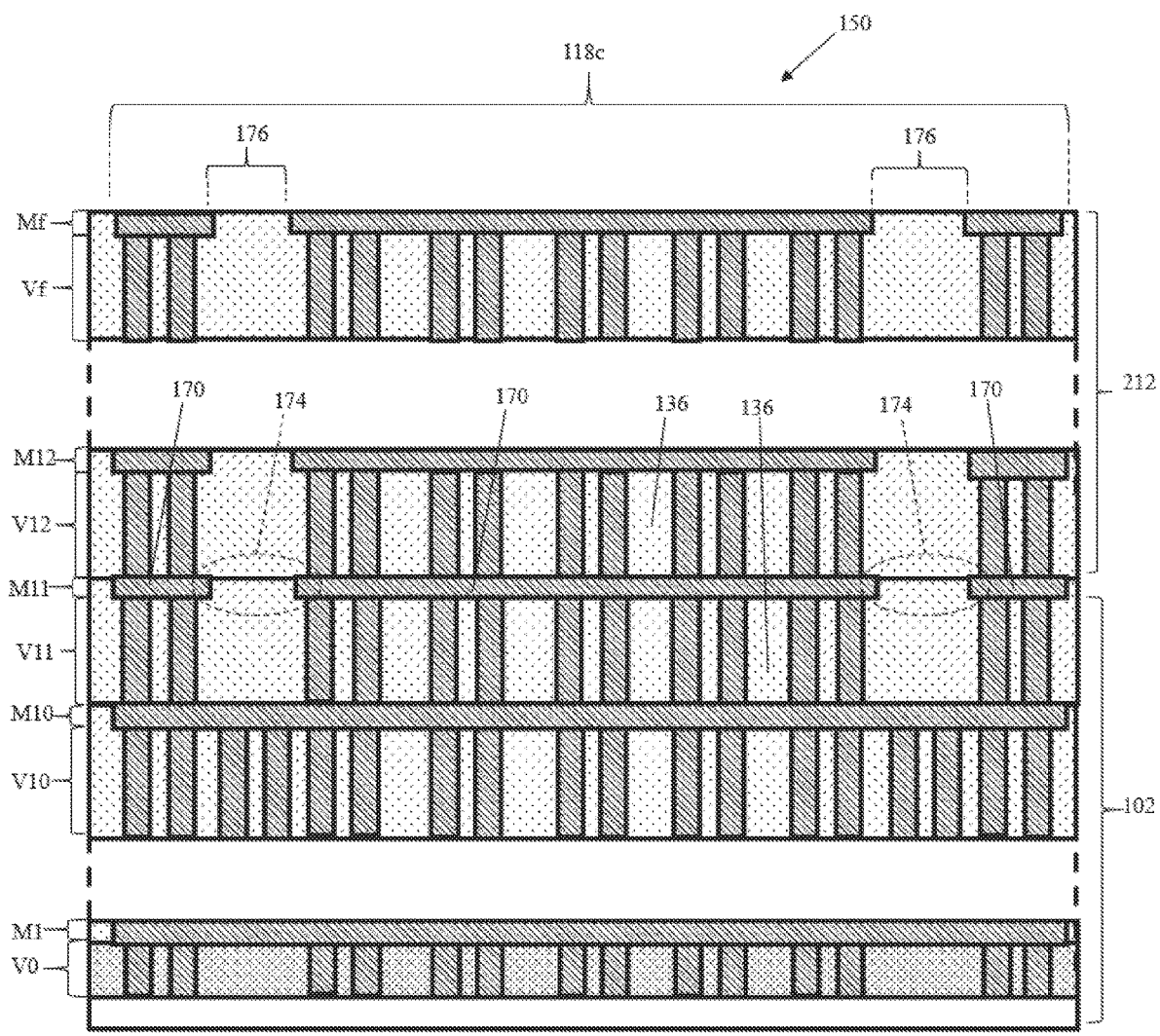
FIG. 5 shows another cross-sectional view of forming a BEOL layer on the initial structure of FIG. 2 using the mask of FIG. 3 at line 5-5, according to embodiments of the disclosure.
Figure 7:
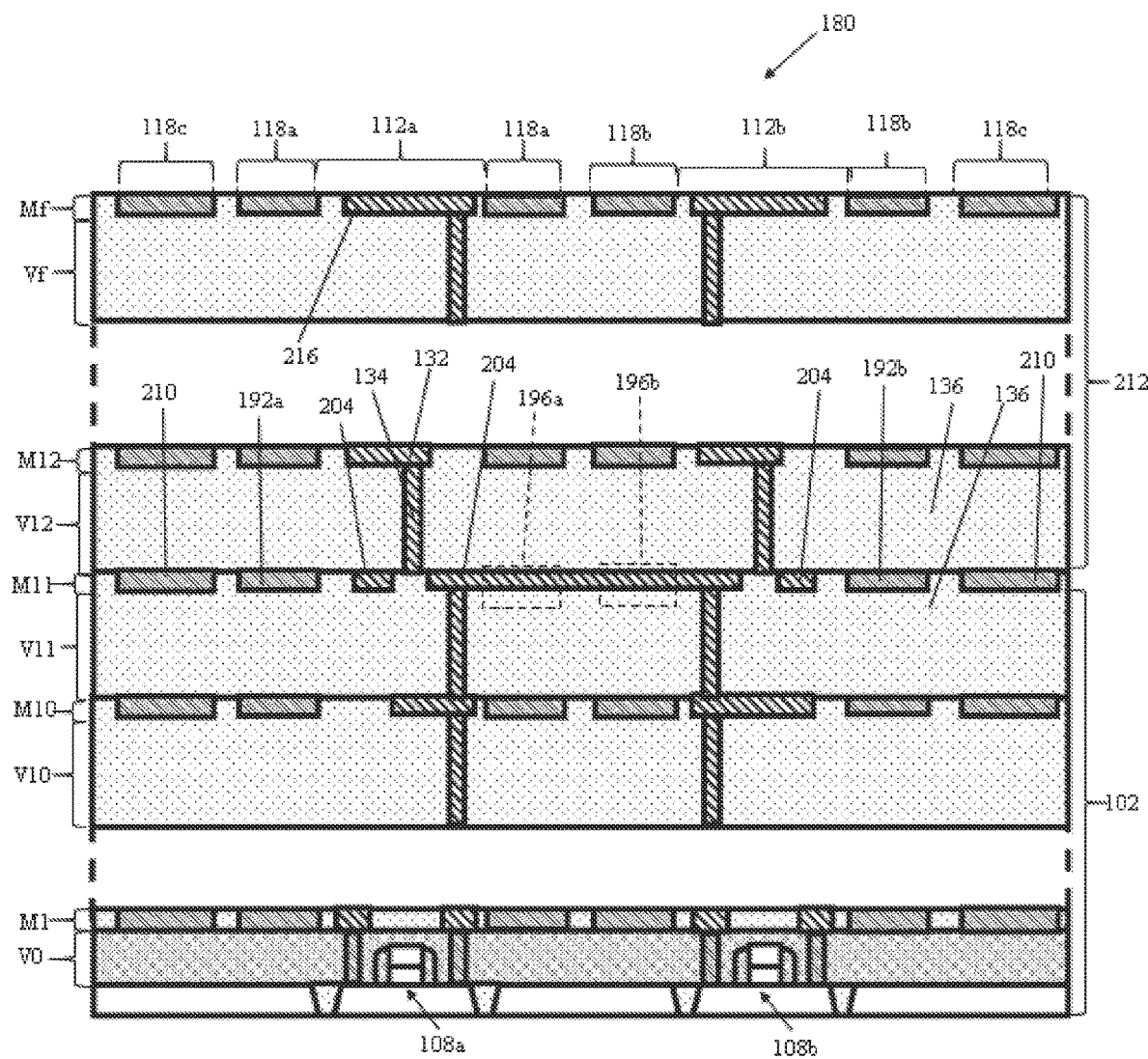
FIG. 7 shows a cross-sectional view of forming a BEOL layer on the initial structure of FIG. 2 using the mask of FIG. 6 at line 7-7, according to embodiments of the disclosure.
Figure 8:
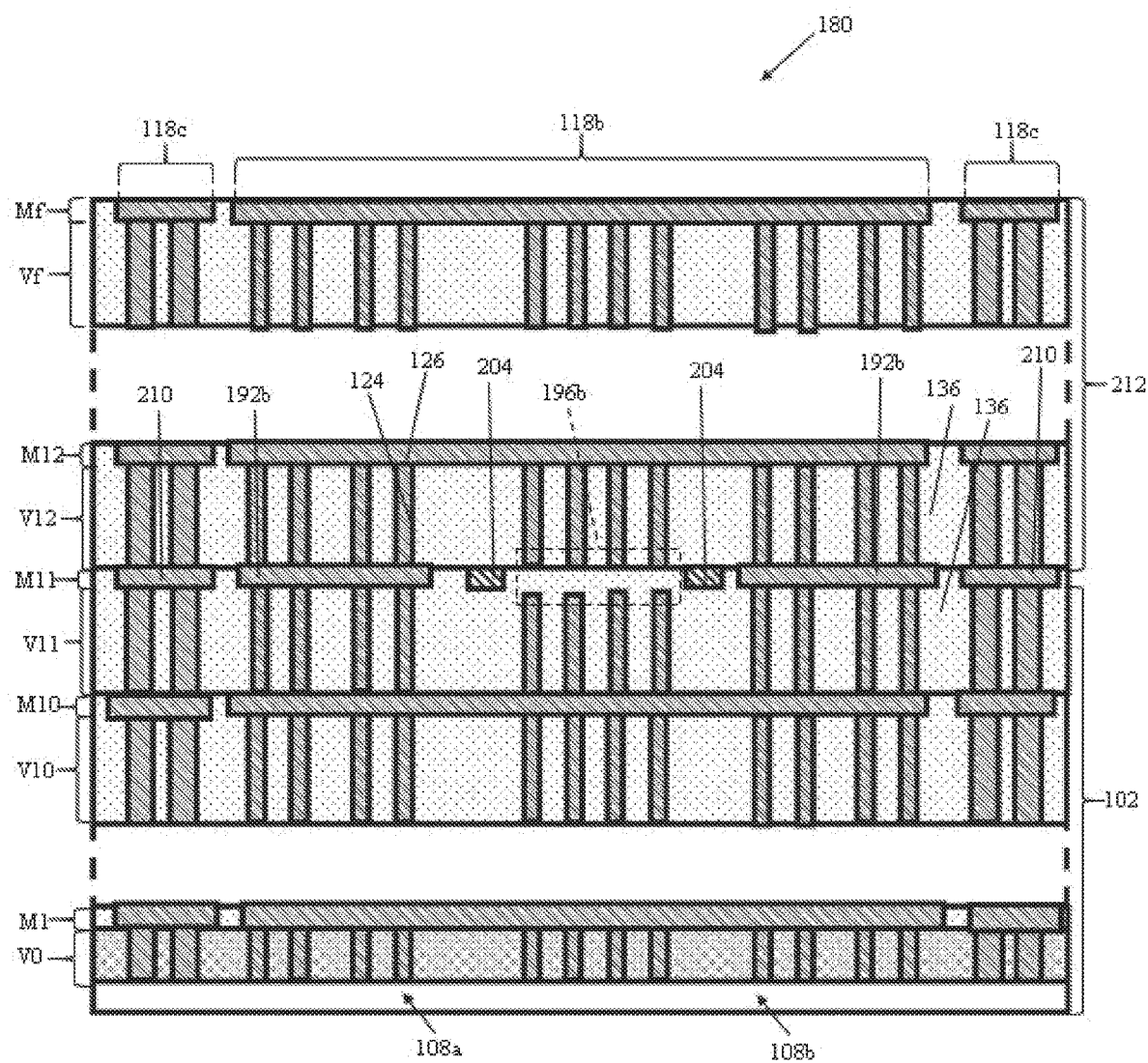
FIG. 8 shows another cross-sectional view of forming a BEOL layer on the initial structure of FIG. 2 using the mask of FIG. 6 at line 8-8, according to embodiments of the disclosure.

Returning to the method of FIG. 1, methods for forming structures according to embodiments of the disclosure may include a second step of selecting one or more interchangeable masks for predetermined BEOL layers based on whether a single IC chip or multiple interconnected IC chip semiconductor structure is desired. For example, at step 2a, a first mask or set of masks for the predetermined BEOL layer(s) for forming single IC chips may be selected. Alternatively, at step 2b, a second mask or set of masks for the predetermined BEOL layer(s) for forming and connecting multiple IC chips for an interconnected IC chip structure may be selected. FIGS. 3-5 show an example of step 2a of the method for forming a BEOL structure for single IC chips from initial structure 102 of FIG. 2. FIGS. 6-8 show an example of step 2b of the method for forming a BEOL structure for multiple interconnected IC chips from initial structure 102 of FIG. 2. As discussed above with respect to initial structure 102 of FIG. 2, although shown in the example of FIGS. 3-8 to include metal layer M11 as the predetermined BEOL layer for interchanging BEOL masks according to embodiments of the disclosure, it is understood that any desirable BEOL layer or layers may be selected for using interchangeable masks as described herein.

Turning first to the example of FIGS. 3-5, forming a predetermined BEOL layer, metal layer M11, on an initial structure 102 according to step 2a of the method (FIG. 1) is shown. Forming metal layer M11 according to step 2a of the method (FIG. 1) may allow for a structure 150 (FIGS. 4 and 5 only) for single IC chips to be formed. FIG. 3 provides a plan view of an example first BEOL layer mask 152 for step 2a of the method of FIG. 1. FIG. 4 provides a cross-sectional view of metal layer M11 formed on initial structure 102 using first BEOL mask 152 of FIG. 3 (e.g., at the line 4-4 of BEOL mask 152 in FIG. 3). FIG. 5 provides another cross-sectional view of metal layer M11 formed on initial structure 102 using first BEOL mask 152 of FIG. 3 (e.g., at the line 5-5 of BEOL mask 152 in FIG. 3).

As shown in FIG. 3, first BEOL mask 152 may include crack-stop pattern openings 156a,b used to form portions of crack-stop structures 118a,b (FIG. 4) within metal layer M11 of semiconductor structure 150. As shown in FIG. 4, crack-stop pattern openings 156a,b in mask 152 of FIG. 3, may be used to form metal layer portions 154a,b of crack-stop structures 118a,b (FIG. 4), respectively, within ILD 136 of metal layer M11. As used herein, the phrase "mask opening used to form" a crack-stop portion will be understood to subsume: using the mask opening to pattern or expose photoresist (PR) over a dielectric of a particular BEOL layer, and the subsequent processing steps leading to crack-stop portion formation including, among possibly other steps, etching the PR to form a PR mask pattern therein, etching the crack-stop portion openings into the dielectric using the PR mask (e.g., via or metal layer depending on die location), depositing a liner (not shown for simplicity) and conductor within the openings, and planarizing. Metal layer portions 154a,b may, for example, be formed into and out of the page of FIG. 4 surrounding the perimeters of first and second IC chip regions 112a,b, respectively.

As also shown in FIG. 3, first BEOL mask 152 may also include metal wire pattern openings 160a,b within first and second IC chip regions 112a,b, respectively. As shown in FIG. 4, metal wire pattern openings 160a,b (FIG. 3) of first BEOL mask 152 may be used for forming metal wires 162a,b, within ILD 136 of metal layer M11 in IC chip regions 112a,b, respectively. Metal wires 162a,b may be formed for interconnecting semiconductor structures therein.

As further shown in FIG. 3, in contrast to conventional BEOL masks for forming single IC chip semiconductor structures, first BEOL mask 152 may also include crack-stop pattern opening 166 surrounding crack-stop pattern openings 156a,b. Crack-stop pattern opening 166 may include openings or breaks 168 in portions of the mask corresponding to dicing channels 174 (FIG. 5) of structure 150. As shown in FIG. 5, crack-stop pattern opening 166 of BEOL mask 152, including openings 168 (FIG. 3), may be used to form metal layer portion 170 of crack-stop structure 118c within ILD 136 of metal layer M11 including openings 168 within dicing channels 174. Forming openings 174 in dicing channels 176 of crack-stop structure 118c may reduce the amount of metal within the dicing channel. Reducing the amount of metal in the dicing channel may reduce the amount of debris and damage that may result during dicing of the final IC structure 150, e.g., along lines D1 (FIG. 3), to form single IC chips. First BEOL mask 152 may be formed by any now known or later developed BEOL fabrication techniques and materials for forming a mask. Metal layer M11 may be formed by any now known or later developed BEOL fabrication techniques and materials for forming layers of a BEOL structure using a mask such as first BEOL mask 152 of FIG. 3.

Turning next to FIGS. 6-8, an example of alternatively forming predetermined BEOL layer, metal layer M11, on initial structure 102 using step 2b of the method (FIG. 1) is shown. As discussed above, according to the method of FIG. 1, a second BEOL mask 182 (FIG. 6) for step 2b may be interchanged with first BEOL mask 152 (FIG. 3) of step 2a at the same processing step to form metal layer M11 having a different layout. For example, forming metal layer M11 using step 2b may allow for a semiconductor structure 180 (FIGS. 7 and 8 only) for multiple interconnected IC chips to be formed. FIG. 6 provides a plan view of an example second BEOL layer mask 182 for step 2b of the method of FIG. 1. FIG. 7 provides a cross-sectional view of metal layer M11 formed using second BEOL mask 182 of FIG. 6 (e.g., at the line 7-7 in FIG. 6). FIG. 8 provides cross-sectional view of metal layer M11 formed using second BEOL mask 182 of FIG. 6 (e.g., at the line 8-8 in FIG. 6). It should be understood that structures of FIGS. 6-8 having the same numbers as structures described herein with respect to FIGS. 3-5 may be formed by the same fabrication processes and materials.

As shown in FIGS. 7 and 8, second BEOL mask 182 (FIG. 6) may be used to form metal layer M11 on via layer V11 of initial structure 102 of FIG. 2. As shown in FIG. 6, second BEOL mask 182 may include crack-stop pattern openings 186a,b around first and second IC chip regions 112a,b, respectively. In contrast to conventional BEOL masks and first BEOL mask 152 (FIG. 3), crack-stop pattern openings 186a,b of second BEOL mask 182 may include openings 188a,b, respectively. Crack-stop pattern openings 168a,b shown in FIG. 6 including openings 188a,b of second BEOL mask 182 may be used to form metal wire portions 192a,b (FIGS. 7 and 8) of crack-stop structures 118a,b (FIGS. 7 and 8) in ILD 136 (FIGS. 7 and 8) of metal layer M11 (FIGS. 7 and 8) including openings 196a,b (FIGS. 7 and 8, in phantom) respectively therein. Openings 196a,b (FIGS. 7 and 8) may allow for interconnects to be formed between IC chip regions. For example, interconnects may be formed through the openings to electrically connect semiconductor structures in first and second IC chip regions 112a,b and/or other semiconductor structures outside of first and second IC chip regions 112a,b. Although shown in the example of FIGS. 6-8 to include openings 196a,b, in metal layer portions 192a,b, respectively, facing one another in metal layer M11, it should be understood that openings 196a,b may be formed in any portion of metal layer portions 192a,b of crack-stop structures 118a,b as may be desirable for forming interconnect wires therethrough.

As also shown in FIG. 6, second BEOL mask 182 may include interconnect wire pattern openings 200 extending between first IC chip region 112a and second IC chip region 112b through openings 188a,b in crack-stop pattern openings 186a,b, respectively. As shown in FIGS. 7 and 8, interconnect wire pattern openings 200 of second BEOL mask 182 (FIG. 6) may be used to form interconnect wire(s) 204 in ILD 136 of metal layer M11 of semiconductor structure 180. For example, interconnect wire(s) 204 may extend through openings 196a,b in metal layer portions 192a,b of crack-stop structures 118a,b. As best shown in FIG. 7, interconnect wire 204 may electrically connect semiconductor devices (e.g., transistor 108a) in first IC chip region 112a of semiconductor structure 180 to another semiconductor device (e.g., transistor 108b) in second IC chip region 112b. Although openings 188a,b and interconnect wire pattern openings 200 therethrough are shown in particular locations in second BEOL mask 182 of FIG. 6, it is understood that second BEOL mask 182 (FIG. 6) may be formed to include interconnect pattern openings 200 and openings 188a,b in any desirable portion of the mask. As a result, openings 196a,b and interconnect wires 204 (FIGS. 7 and 8) may be in any desirable location to connect semiconductor structures in first and/or second IC chip regions 112a,b to any other semiconductor structure therebelow.

As also shown in FIG. 6, second BEOL mask 182 may include crack-stop pattern opening 208 surrounding crack-stop pattern openings 186a,b. As shown in FIGS. 7 and 8, crack-stop pattern opening 208 may be used to form metal layer portion 210 of crack-stop structure 118c to be formed within ILD 136 of metal layer M11 surrounding crack-stop structures 118a,b. For example, crack-stop structure 118c may be formed into and out of the page of FIGS. 7 and 8 to surround crack-stop structures 118a,b. Forming metal layer portion 210 of crack-stop structure 118c may protect interconnect wire(s) 204, and other exposed structures during subsequent dicing of the semiconductor wafer along dicing lines D2 shown in FIG. 6.

Second BEOL mask 182 may be formed by any now known or later developed fabrication techniques and materials for forming a mask. Metal layer M1 and the structures therein be formed using second BEOL mask 182 and any now known or later developed BEOL fabrication techniques and materials for forming a BEOL metal layer using a mask.

In contrast to conventional MCM interconnect techniques, forming a predetermined BEOL layer, e.g., metal layer M11, at step 2b of the method (FIG. 1) using second BEOL mask 182 may allow for set of interconnected IC chips to be formed. For example, using second BEOL mask 182 may allow for semiconductor devices in different IC chip regions, i.e., separated by crack-stops, to be interconnected to one another during BEOL fabrication. Forming interconnects between structures of distinct IC chip regions during BEOL fabrication may allow for unique and novel interconnected IC chip structures to be formed. For example, by forming interconnects between IC chip regions during BEOL fabrication, the packaging and assembly lead interconnects previously necessary for interconnecting semiconductor devices of distinct IC chips are reduced or eliminated. Additionally, forming interconnects between IC chips regions in the BEOL may improve the bandwidth for communication between interconnected IC chips, e.g., as compared to IC chips in an MCM.

Returning to the method of FIG. 1, methods for forming structures according to embodiments of the disclosure may include a third step, step 3, of conventional BEOL formation on the structure(s) formed in step 2a or step 2b. Step 3 may be the same for either structure formed by step 2a or step 2b of the method. For example, as shown in FIGS. 4, 5, 7 and 8, step 3 may include forming a remainder 212 of BEOL layers on predetermined BEOL layer metal layer M11 for either structure 150 (FIGS. 4 and 5) or structure 180 (FIGS. 7 and 8). As indicated by the dotted lines in FIGS. 4, 5, 7 and 8, remainder 212 of the BEOL layers of semiconductor structures 150 (FIGS. 4 and 5) and 180 (FIGS. 7 and 8) may vary in number based on the predetermined BEOL layer and the total number of BEOL layers desired.

Referring to FIGS. 4, 5, 7 and 8 together, examples of remainder 212 formed according to step 3 of the method (FIG. 1) are shown. For example, remainder 212 may be formed on predetermined BEOL layer metal layer M11 to form structure 150 (FIGS. 4 and 5) or structure 180 (FIGS. 7 and 8) after step 2a or 2b. As shown in the example of FIGS. 4, 5, 7 and 8, remainder 212 may include via layer V12 and metal layer M12 through via final via layer Vf and final metal layer Mf, where 'f' indicates a respective final layer. The metal layers and via layers of remainder 212 may include additional stacked interconnect structures such as vias 134 and metal wires 132 formed within ILD 136 for interconnecting semiconductor devices therebelow. As also shown in FIGS. 4, 5, 7 and 8, the metal layers and via layers of remainder 212 may also include portions of crack-stop structures 118a,b,c extending therein. For example, conventional via layer crack-stop portions 124 and metal layer crack-stop portions 126 may be formed within ILD 136 of the via layers and metal layers of remainder 212. As further shown in FIGS. 4, 5, 7 and 8, final metal layer Mf of remainder 212 may include bond pads 216 in ILD 136 for electrically connecting devices of the semiconductor structures to external structures such as, for example, packing, power sources, etc. Bond pads 216 may be formed in ILD by any now known or later developed BEOL fabrication processes for forming bond pads. For example, bond pads 216 may be formed by depositing conductive materials such as aluminum (Al) in trenches above vias 134 in final via layer Vf. As discussed above, remainder 212 for either structure 150 (FIGS. 4 and 5) or 180 (FIGS. 7 and 8) may be formed by any now known or later developed BEOL fabrication techniques.

The method (FIG. 1) of the disclosure as shown in the examples of FIGS. 1-8 may allow for BEOL structures for either single IC chips or multiple interconnected IC chips to be formed using similar fabrication schemes with one or more interchangeable BEOL masks. Forming structures according to the method described herein may reduce the cost of fabrication by preventing the need for multiple fabrication design schemes. Additionally, forming structures according to the method (FIG. 1), may allow for adjustable and customizable chip layouts, adjustable crack-stop layouts, customizable chip sizes, etc. Further, as discussed above with respect to FIGS. 6-8, forming BEOL structures to include interconnects between distinct IC chip regions may allow for a unique and novel interconnected IC chip structure. For example, using steps 1, 2b and 3 to form a structure having interconnected IC chip regions at the BEOL may improve bandwidth for communication between IC chips, reduce the need for packaging and assembly lead interconnects between IC chips, improve packaging sizes, generally improve the performance of structures having interconnected IC chips, etc.

Turning next to FIGS. 9-22, another example of steps 1, 2b, and 3 of the method (FIG. 1) is show, according to embodiments of the disclosure. Although step 2a or step 2b of the method of FIG. 1 is shown in the examples of FIGS. 2-8 to include a single set of interchangeable masks for a single predetermined BEOL layer (i.e., one mask for each step 2a and 2b), forming structures according to embodiments of the disclosure may include any number of predetermined BEOL layers for interchanging masks. FIGS. 9-22 provide an example of the method of FIG. 1 including multiple predetermined BEOL interchangeable mask layers at step 2b, according to embodiments of the disclosure. Additionally, although the example of FIGS. 2-8 shows forming a structure having two same sized IC chip regions, it is understood that the method of FIG. 1 may be used to form a structure having any number and/or size of IC chip regions for either single IC chips or multiple interconnected IC chips. FIGS. 9-22 also provide an example of forming a structure having three IC chip regions having different sizes, according to embodiments of the disclosure. Although an example of step 2a is not shown, it is understood that additional masks for step 2a for forming single IC chips may be formed and used at the predetermined BEOL layers interchangeably with the masks described herein with respect to step 2b of FIGS. 9-22. It should also be understood that structures of FIGS. 9-22 having the same numbers as structures described herein with respect to FIGS. 1-8 may be similar and formed by the same fabrication processes and materials.

Figure 9:
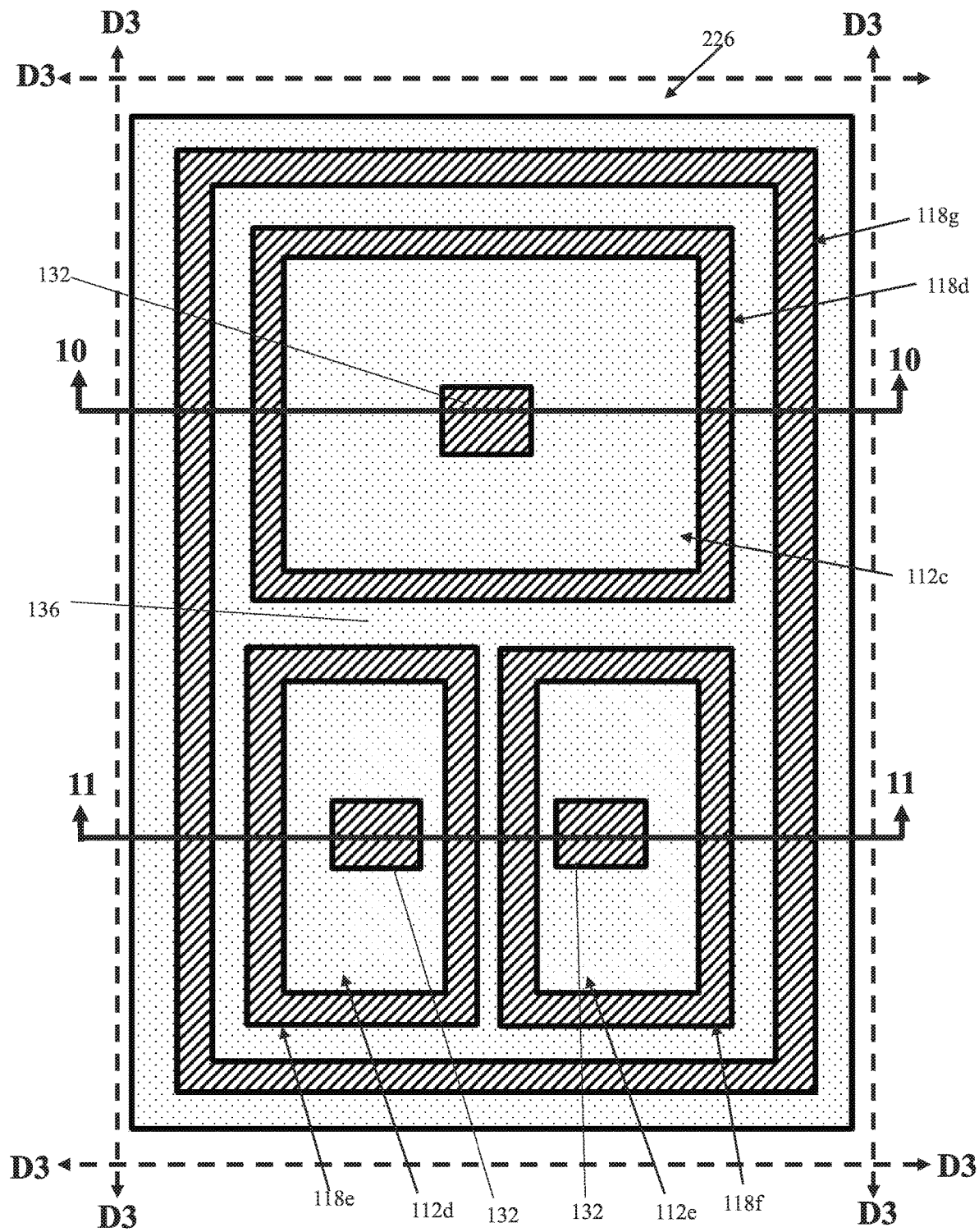
FIG. 9 shows a plan view of another initial structure, according to embodiments of the disclosure.
Figure 10:
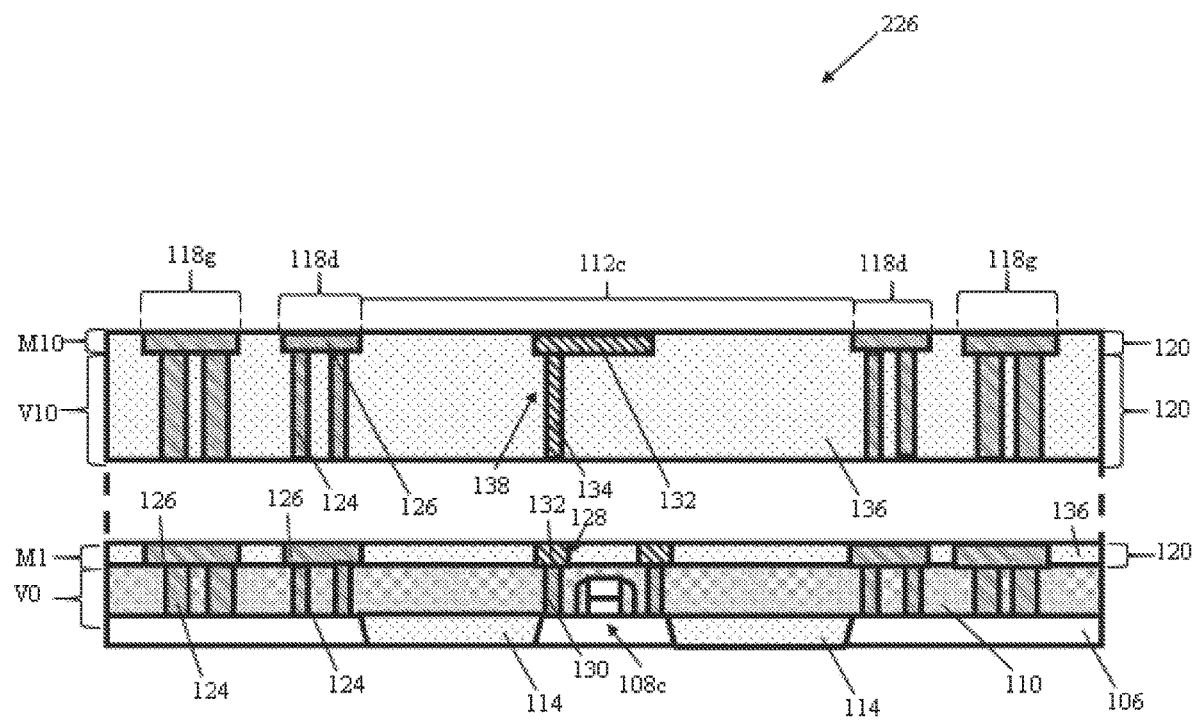
FIG. 10 shows a cross-sectional view of the initial structure of FIG. 9 at line 10-10 of FIG. 9, according to embodiments of the disclosure.
Figure 11:
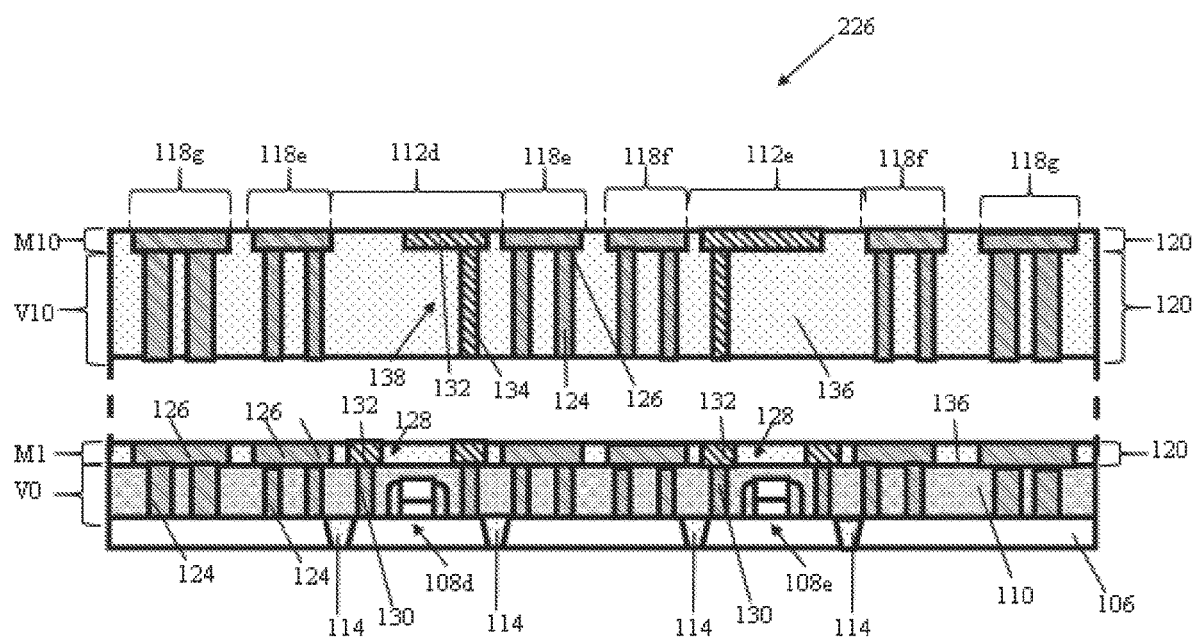
FIG. 11 shows a cross-sectional view of the initial structure of FIG. 9 at line 11-11 of FIG. 9, according to embodiments of the disclosure.

Referring first to FIGS. 9-11, another example of an initial structure 226 according to step 1 of the method (FIG. 1) is shown. Initial structure 226 may be used to form a BEOL structure for either single IC chips or multiple interconnected IC chips, according to embodiments of the disclosure. FIG. 9 provides a plan view of initial structure 226; FIG. 10 provides a cross-sectional view of initial structure 226 at structural line 10-10 of FIG. 9; and FIG. 11 provides a cross-sectional view of initial structure 226 at structural line 11-11 of FIG. 9. As shown in FIGS. 9-12, similarly to initial structure 102 of FIG. 2, initial structure 226 may include multiple IC chip regions corresponding to IC chips that may be subsequently formed therefrom. In contrast to initial structure 102 of FIG. 2, initial structure 226 may include three IC chip regions and different sized IC chip regions. For example, initial structure 226 may include a first IC chip region 112c; a second IC chip region 112d; and a third IC chip region 112e. First IC chip region 112c may be larger than second and third IC chip regions 112d,e, while second and third IC chip regions 112d,e may be a similar size. Although three IC chip regions having two different sizes are shown, it is understood that any number of IC chip regions of any number of different sizes may be formed according to embodiments of the disclosure.

As also shown in FIGS. 9-12, each IC chip region 112c,d,e may be surrounded by a crack-stop structure, e.g., crack-stop structures 118d,e,f, for protecting the layers therein from delamination or the semiconductor structures therein from damage during subsequent processing. As also shown in FIGS. 9-12, initial structure 226 may also include a fourth crack-stop structure 118g surrounding IC chip regions 112c,d,e and first, second and third crack-stop structures 118d,e,f. Fourth crack-stop structure 118g may also protect the layers and semiconductor structures from delamination and damage during subsequent processing, for example, during dicing at lines D3 (FIG. 9) around the fourth crack-stop structure to form a interconnected IC chip structure according to embodiments of the disclosure.

Referring next to the cross-sectional views of FIGS. 10 and 11 together, similarly to initial structure 102 (FIG. 2), initial structure 226 may include a device layer or initial via layer V0 positioned on a substrate 106. Initial via layer V0 may include IDL 110, and semiconductor structures positioned therein. For example, as shown in FIGS. 10 and 11, initial via layer V0 of initial structure 226 may include transistors 108c,d,e within ILD 110 in IC chip regions 112c,d,e, respectively. Additionally initial via layer V0 may include via layer portions 124 of crack-stop structures 118d,e,f,g within ILD 110. As also shown in FIGS. 10 and 11, initial via layer V0 of initial structure 226 may include interconnect vias 130 in ILD 110 for interconnecting semiconductor structures therein to BEOL layers for electrical connection with other semiconductor structures. Substrate 106 of initial structure 226 may include STIs 114 therein for electrically isolating semiconductor devices within each IC chip region from other semiconductor devices.

As also shown in FIGS. 10 and 11, similarly to initial structure 102 of FIG. 2, initial structure 226 may include at least one BEOL layer above initial via layer V0. In contrast to the example of the method (FIG. 1) shown in FIGS. 6-8, in the example of FIGS. 9-22 step 2b may include multiple predetermined BEOL layers. In the non-limiting example of FIGS. 9-22, the predetermined BEOL layers may include metal layers M11-M12 and via layers V11-V12. As a result, as shown in the example of FIGS. 10 and 11, initial structure 226 may include BEOL via layers V1-V10 and BEOL metal layers M1-M10 positioned on initial via layer V0. Similarly to initial structure 102 (FIG. 2), the dotted lines in initial structure 226 may represent multiple BEOL via and metal layers not shown for purposes of simplicity (e.g., via layers V1-V9, and metal layers M2-M9). Also similarly to initial structure 102 (FIG. 2), the stacked, alternating BEOL via and metal layers of initial structure 226 may include interconnect structures such as vias 134 and metal wires 132 within ILD 136 of the via layers and metal layers, respectively. The vias and metal wires in the BEOL layers may electrically connect semiconductor devices in initial via layer V0 to other semiconductor structures. Additionally, the BEOL layers of initial structure 226 may include portions of crack-stop structures 118d,e,f,g extending therein. For example, the via layers (e.g., shown as via layer V10) may include via layer portions 124 of the crack-stop structures, and the metal layers (e.g., shown as metal layers M1, M10) may include metal layer crack-stop portions 126 of the crack-stop structures.

Turning next to FIGS. 12-22, an example of forming predetermined BEOL layers M11-M12, and V11-V12 on initial structure 226 (FIGS. 9-11) according to step 2b of the method (FIG. 1) is shown, according to embodiments of the disclosure. As will be discussed with respect to FIGS. 12-22 herein, step 2b of the method (FIG. 1) may include using interchangeable masks at four predetermined BEOL layers for forming a BEOL structure from initial structure 226 including interconnects between IC chip regions for forming interconnected IC chips. Again, although using interchangeable masks to form a BEOL structure for single IC chips from initial structure 226 at step 2a of the method (FIG. 1) is not shown, it is understood that the processes described herein with respect to FIGS. 11-19 may be modified to use interchangeable masks for single IC chips, accordingly.

Figure 12:
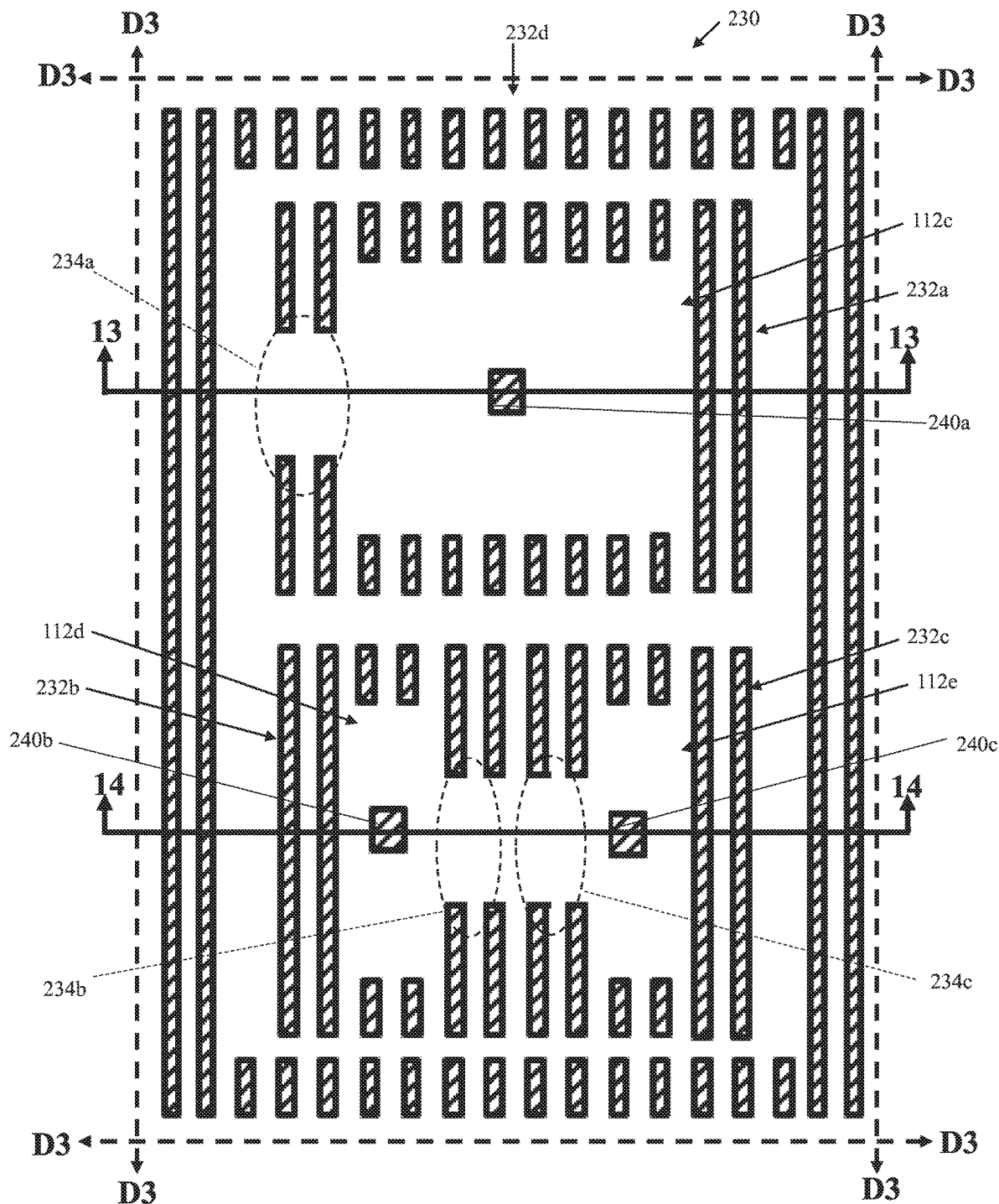
FIG. 12 shows a plan view of a mask for forming a BEOL layer on the initial structure of FIG. 9, according to embodiments of the disclosure.
Figure 13:
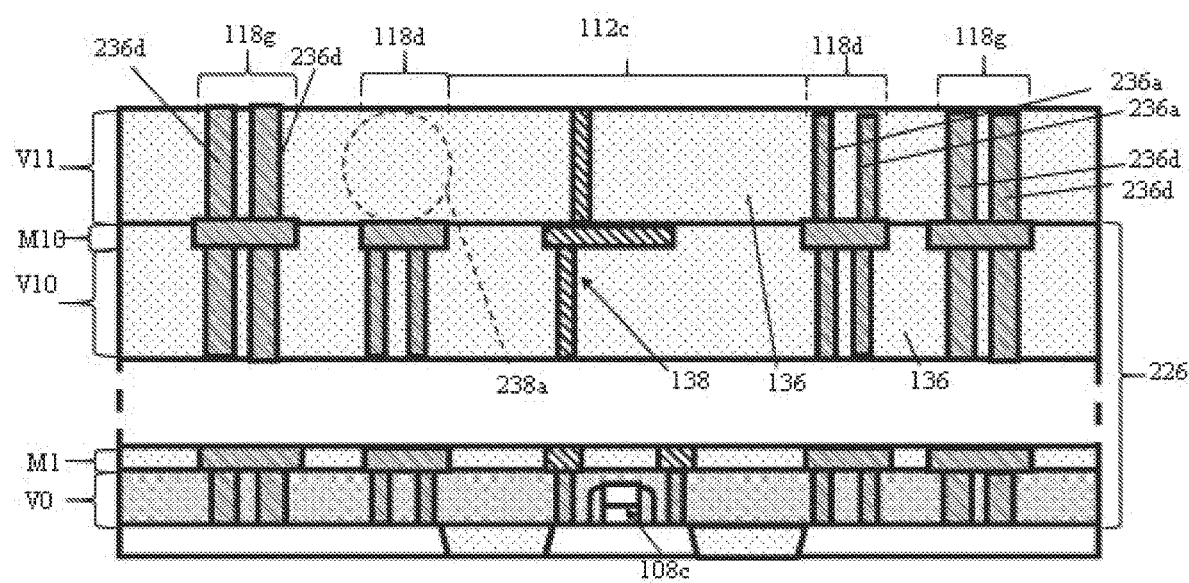
FIG. 13 shows a cross-sectional view of forming a BEOL layer on the initial structure of FIG. 9 using the mask of FIG. 15 at line 13-13 of FIG. 12, according to embodiments of the disclosure.
Figure 14:
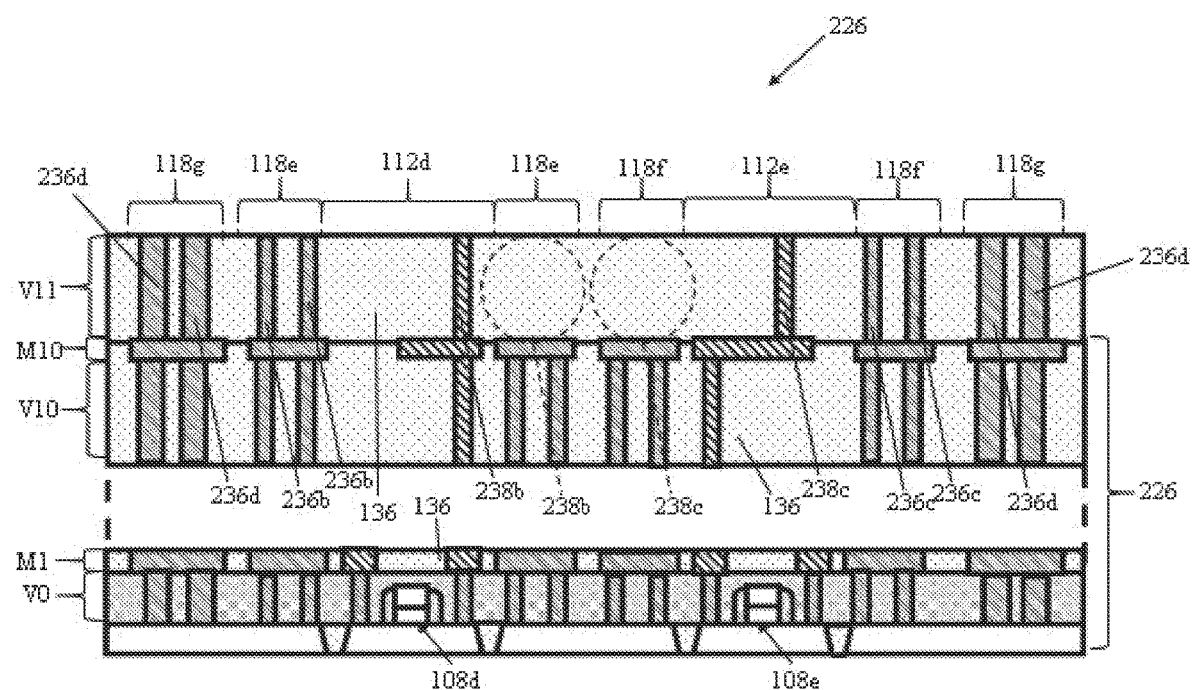
FIG. 14 shows another cross-sectional view of forming a BEOL layer using the mask of FIG. 15 at line 14-14 of FIG. 12, according to embodiments of the disclosure.

Turning first to FIGS. 12-14, a first BEOL mask 230 (FIG. 12 only) for forming a first predetermined BEOL layer on initial structure 226 is shown. For example, first BEOL mask 230 may be used at step 2b of the method (FIG. 1) to form via layer V11 on metal layer M10 of initial structure 226. As shown in FIG. 12, first BEOL mask 230 may include crack-stop pattern openings 232a,b,c surrounding first, second and third IC chip regions 112c,d,e, respectively. In contrast to conventional BEOL masks, first BEOL mask 230 may include openings or breaks 234a,b,c, in crack-stop pattern openings 232a,b,c, respectively. As shown in FIG. 13, crack-stop pattern opening 230a including opening 232a of first BEOL mask 230 (FIG. 12) may be used to form via layer portions 236a of crack-stop structure 118d around first IC chip region 112c in ILD 136 of via layer V11 including opening 238a therein. As shown in FIG. 14, crack-stop pattern opening 234b including opening 234b of first BEOL mask 230 (FIG. 12) may be used to form vias layer portion 236b of crack-stop structure 118e including opening 238b within ILD 136 of via layer V11 around second IC chip region 112d. As also shown in FIG. 14, crack-stop pattern opening 234c including opening 234c of first BEOL mask 230 (FIG. 12) may be used to form via layer portion 236c of crack-stop structure 118f including opening 238c within ILD 136 of via layer V11 around second IC chip region 112e. Openings 238a,b,c in via layer portions 236a,b,c, in via layer V11 may mitigate and/or prevent subsequently formed interconnects positioned above openings 238a,b,c, from being shorted by physically contacting portions of the crack-stops within the via layer. Although openings 238a,b,c are shown in a particular location in via layer portions 236a,b,c, of crack-stop structures 118d,e,f, it is understood that the openings may be formed in any portion of the crack-stop structures as may be desirable for forming isolated interconnect wires thereabove.

As also shown in FIG. 12, first BEOL mask 230 may also include interconnect via pattern openings 240a,b,c within each of first, second and third IC chip regions 112c,d,e, respectively. As shown in FIG. 13, interconnect via pattern opening 240a of first BEOL mask 230 (FIG. 12) may be used to form interconnect via 242a within ILD 136 of via layer V11 in first IC chip region 112c. As shown in FIG. 14, interconnect via pattern openings 240b,c may be used to form interconnect vias 242b,c within ILD 136 of via layer V11, e.g., in second and third IC chip regions 112d,e, respectively. Interconnect vias 242a,b,c, may electrically connect with metal wires (e.g., metal wires 132) in metal layer M10 therebelow and thereabove in order to interconnect semiconductor devices of IC chip regions 112d,e,f to other semiconductor structures.

As also shown in FIG. 12, first BEOL mask 230 may include crack-stop pattern opening 234d surrounding crack-stop pattern openings 234a,b,c. As shown in FIGS. 13 and 14, crack-stop pattern 234d may be used to form via layer portion 236d of fourth crack-stop structure 118g within ILD 136 of metal layer M11 surrounding crack-stop structures 118d,e,f. Forming portions of fourth crack-stop structure 118g in BEOL layers such as via layer V11 may protect other structures therein, for example, during a subsequent dicing process along dicing lines D3.

First BEOL mask 230 may be formed by any now known or later developed BEOL fabrication techniques and materials for forming a mask. Via layer V11 and the structures therein be formed using first BEOL mask 230 and any now known or later developed BEOL fabrication techniques and materials for forming a BEOL metal layer using a mask.

Figure 15:
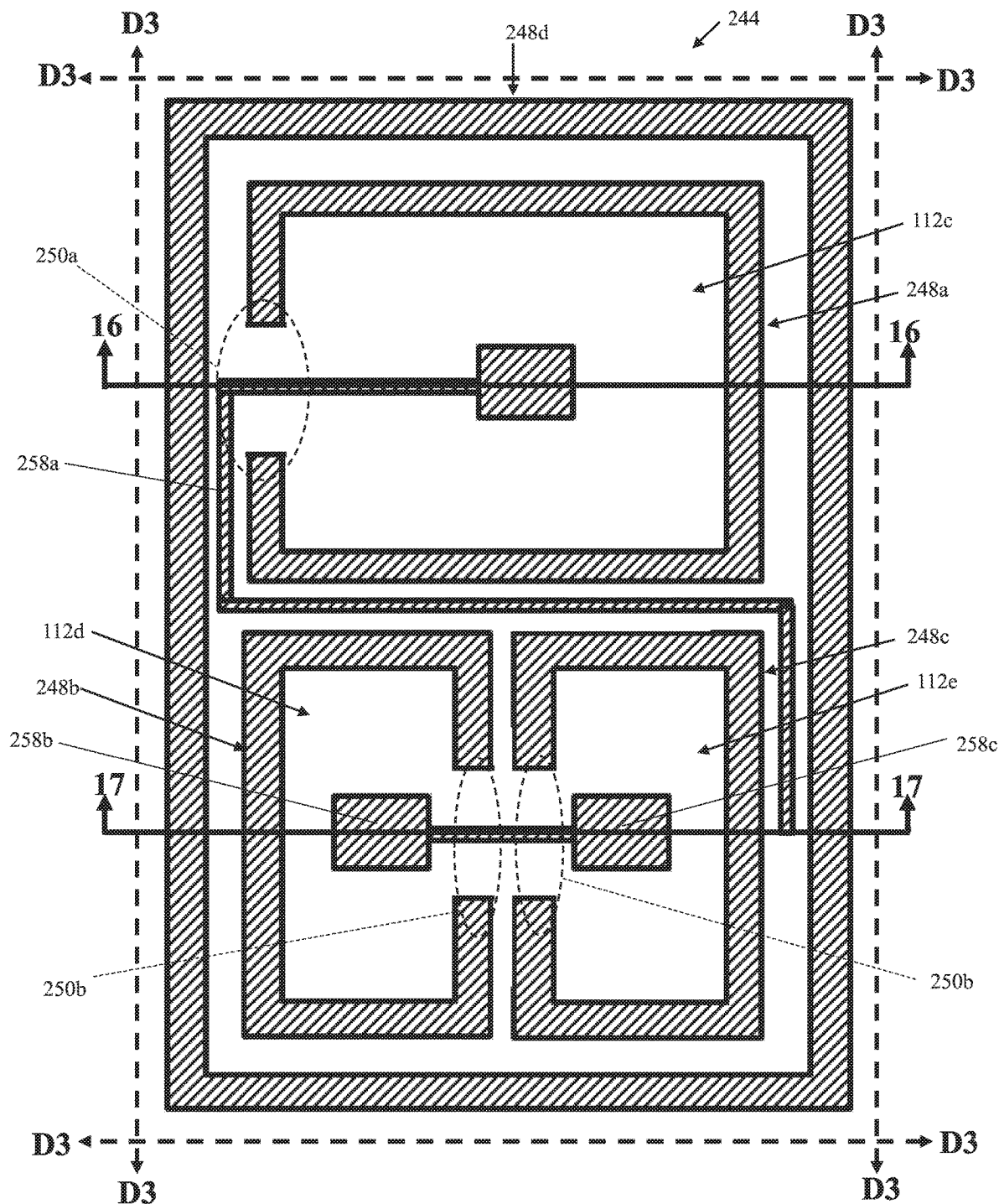
FIG. 15 shows a plan view of another mask for forming a second BEOL layer on the structure of FIGS. 13 and 14, according to embodiments of the disclosure.
Figure 16:
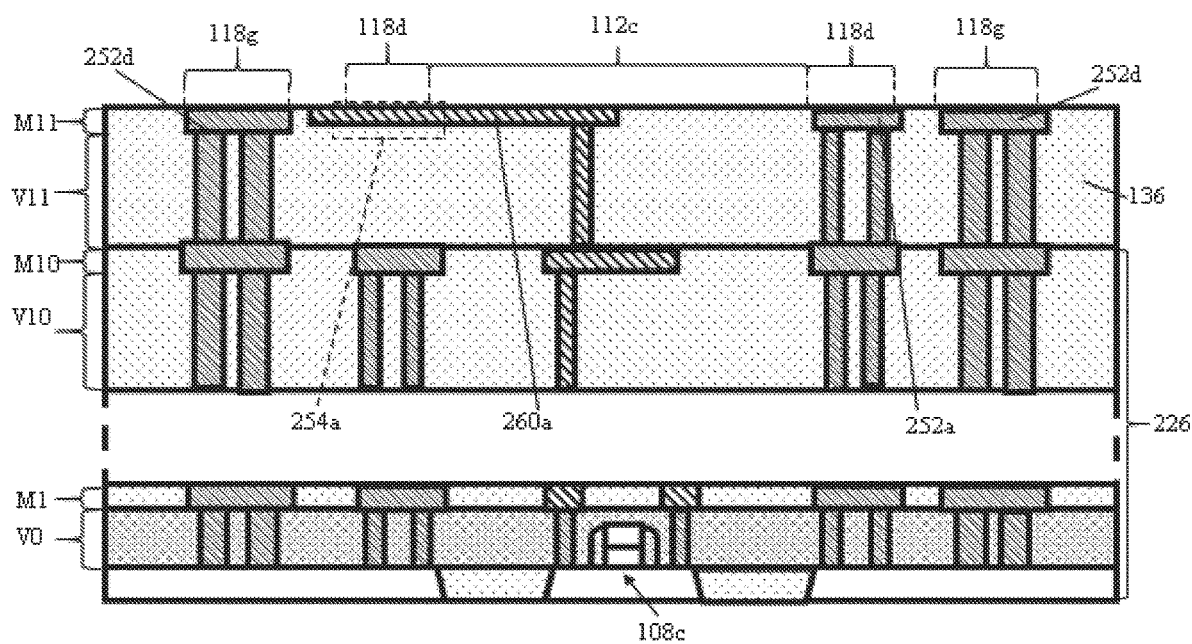
FIG. 16 shows a cross-sectional view of forming a second BEOL layer on the structure of FIG. 13 using the mask of FIG. 15 at line 16-16 of FIG. 15, according to embodiments of the disclosure.
Figure 17:
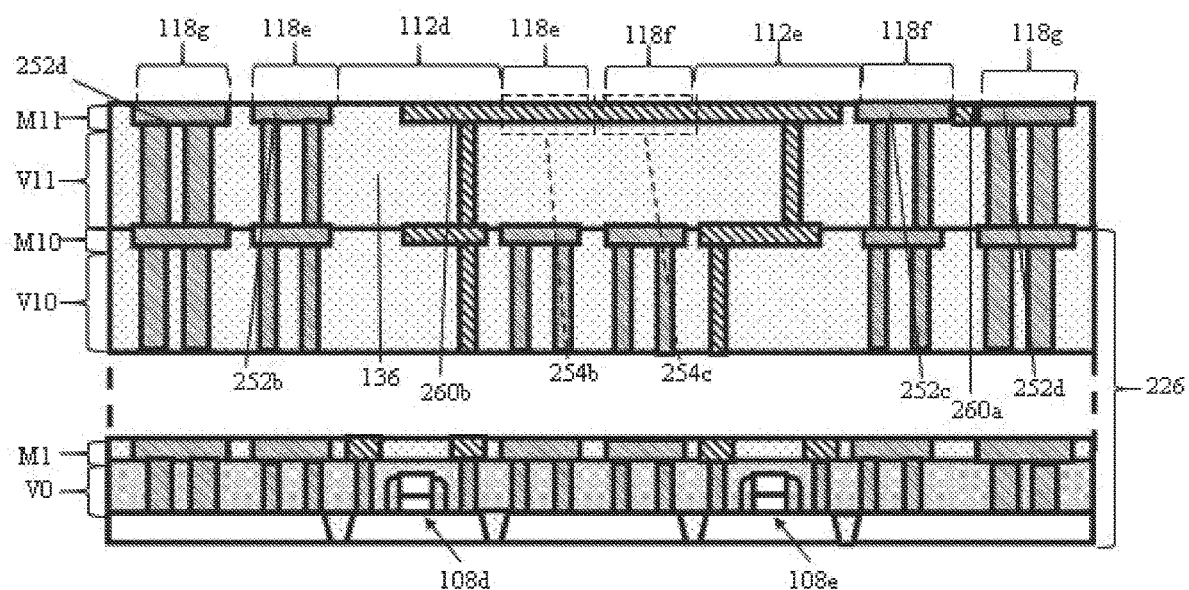
FIG. 17 shows another cross-sectional view of forming a second BEOL layer using the mask of FIG. 14 at line 17-17 of FIG. 15, according to embodiments of the disclosure.

Turning next to FIGS. 15-17, a second BEOL mask 244 (FIG. 15 only) for forming a second predetermined BEOL layer on first BEOL layer via layer V11, is shown. For example, second BEOL mask 244 may be used at step 2b of the method (FIG. 1) to form metal layer M11 on via layer V11 (FIGS. 16 and 17).

As shown in FIG. 15, second BEOL mask 244 may include crack-stop pattern openings 248a,b,c surrounding first, second and third IC chip regions 112c,d,e, respectively. As also shown in FIG. 15, in contrast to conventional BEOL masks, crack-stop pattern openings 248a,b,c may each include openings or breaks 250a,b,c, respectively. As shown in FIG. 16, crack-stop pattern opening 248a including opening 250a of second BEOL mask 244 (FIG. 15) may be used to form metal layer portion 252a of crack-stop structure 118d within ILD 136 of metal layer M1 around first IC chip region 112c. For example, metal layer portion 252a may extend into and out of the page of FIG. 16 to surround first IC chip region 112c. As also shown in FIG. 16, opening 250a in crack-stop pattern opening 248a of second BEOL mask 244 (FIG. 16) may allow metal layer portion 252a to include opening 254a therein. As shown in FIG. 17, crack-stop pattern opening 248b including opening 250b of second BEOL mask 244 (FIG. 15) may be used to form metal layer portion 252b of crack-stop structure 118e including opening 254b within ILD 136 of metal layer M11 surrounding second IC chip region 112d. For example, metal layer portion 252b may extend into and out of the page of FIG. 17 to surround second IC chip region 112d. As also shown in FIG. 17, crack-stop pattern opening 248c including opening 250c of second BEOL mask 244 (FIG. 15) may be used to form metal layer portion 252c of crack-stop structure 118f including opening 254c within ILD 136 of metal layer M11 surrounding third IC chip region 112e. For example, metal layer portion 252c may extend into and out of the page of FIG. 17 to surround third IC chip region 112e. Openings 254a,b,c may allow for interconnects to be formed between structures within IC chip regions 112c,d,e and other structures throughout the BEOL structure. Although openings 254a,b,c are shown in a particular location in metal layer portions 252a,b,c of crack-stop structures 118d,e,f, it is understood that the openings may be formed in any portion of the crack-stop structures as may be desirable for forming interconnect wires therethrough.

As also shown in FIG. 15, second BEOL mask 244 may include interconnect wire pattern openings 258a,b extending through at least one of openings 250a,b,c in crack-stop pattern openings 248a,b,c. For example, interconnect wire pattern opening 258a may extend out of second IC chip region 112c through opening 250a of crack-stop pattern opening 248a. Interconnect wire pattern opening 258b may extend between second and third IC chip regions 112d,e through openings 250b,c of crack-stop pattern openings 248b,c. As shown in FIG. 16, interconnect wire pattern opening 258a of second BEOL mask 244 (FIG. 15) may be used to form interconnect wire 260a within ILD 136 of metal layer M11. For example, interconnect wire 260a may extend from second IC chip region 112c, through opening 254a to allow for structures (e.g., transistor 108c) within first IC chip region 112c to be electrically connected to other semiconductor structures outside of first IC chip region 112c. As shown in FIG. 17, interconnect wire 260a may extend from first IC chip region 112c, into and out of the page through metal layer M11, to a position between third crack-stop structure 118f and fourth crack-stop structure 118g. As also shown in FIG. 17, interconnect wire pattern opening 258b of second BEOL mask 244 (FIG. 15) may be used to form interconnect wire 260b within ILD 136 of metal layer M11 between second IC chip region 112d and third IC chip region 112e. For example, interconnect wire 260b may through opening 254b of crack-stop structure 118e and opening 254c of crack-stop structure 118f to allow for structures within the IC chip regions to be electrically interconnected. Although interconnect wires 260a,b are shown to extend from certain IC chip regions to other specific locations within the BEOL structure, it is understood that the interconnect wires may be formed from any IC chip region to any other semiconductor structure.

As further shown in FIG. 15, second BEOL mask 244 may include crack-stop pattern opening 248d surrounding crack-stop pattern openings 248a,b,c. As shown in FIGS. 16 and 17, crack-stop pattern opening 248d may be used to form metal layer portion 252d of fourth crack-stop structure 118g within ILD 136 of metal layer M11 surrounding crack-stop structures 118d,e,f. As discussed above, fourth crack-stop structure 118g may be formed to protect structures (e.g., interconnect wire 260a extending outside of first crack-stop structures 118d) it surrounds during subsequent dicing of the semiconductor wafer, for example, along dicing lines D3.

Second BEOL mask 244 may be formed by any now known or later developed BEOL fabrication techniques and materials for forming a mask. Metal layer M11 and the structures therein be formed using second BEOL mask 244 and any now known or later developed BEOL fabrication techniques and materials for forming a BEOL metal layer using a mask.

Figure 18:
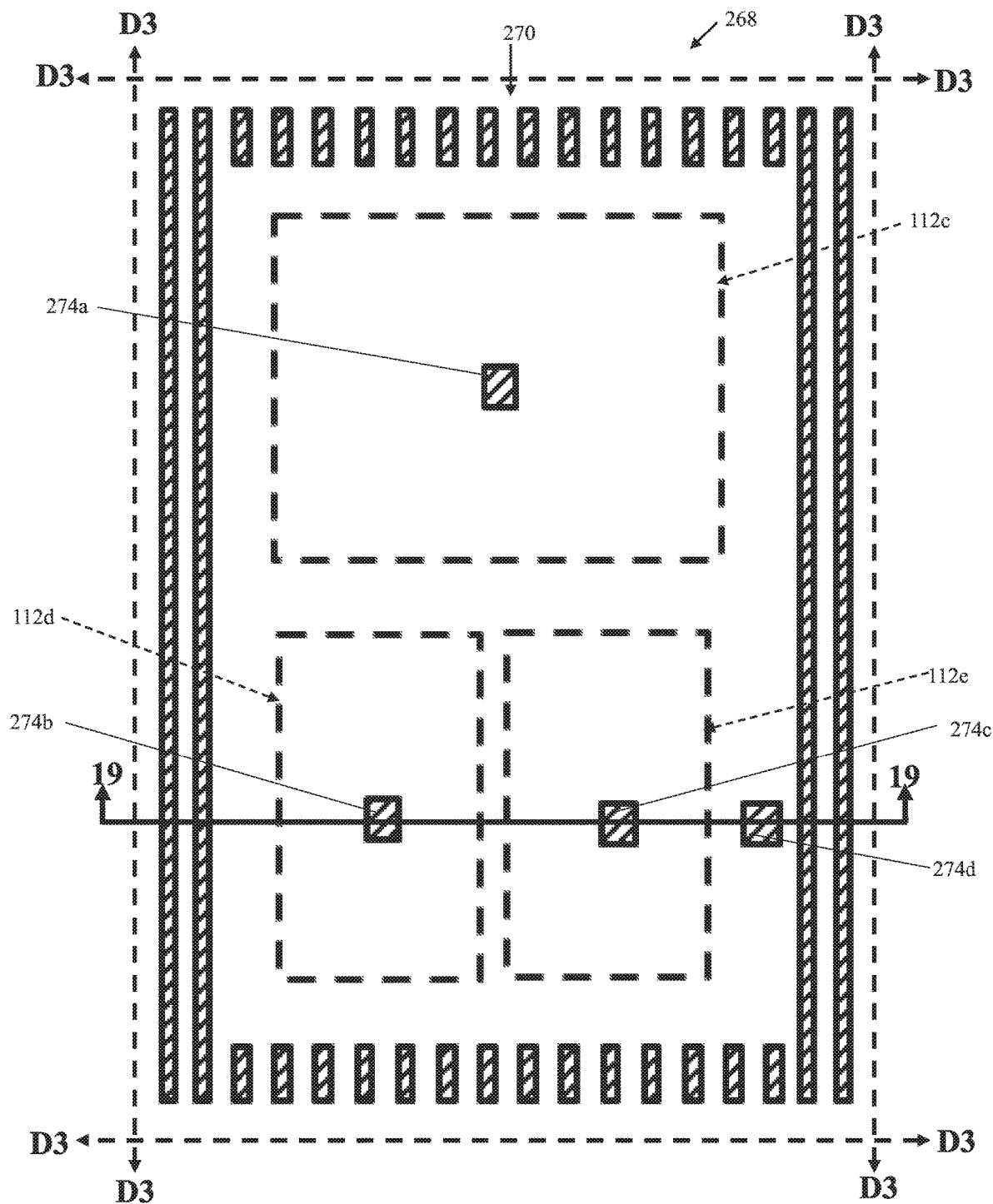
FIG. 18 shows a plan view of another mask for forming a third BEOL layer on the structure of FIGS. 16 and 17, according to embodiments of the disclosure.
Figure 19:
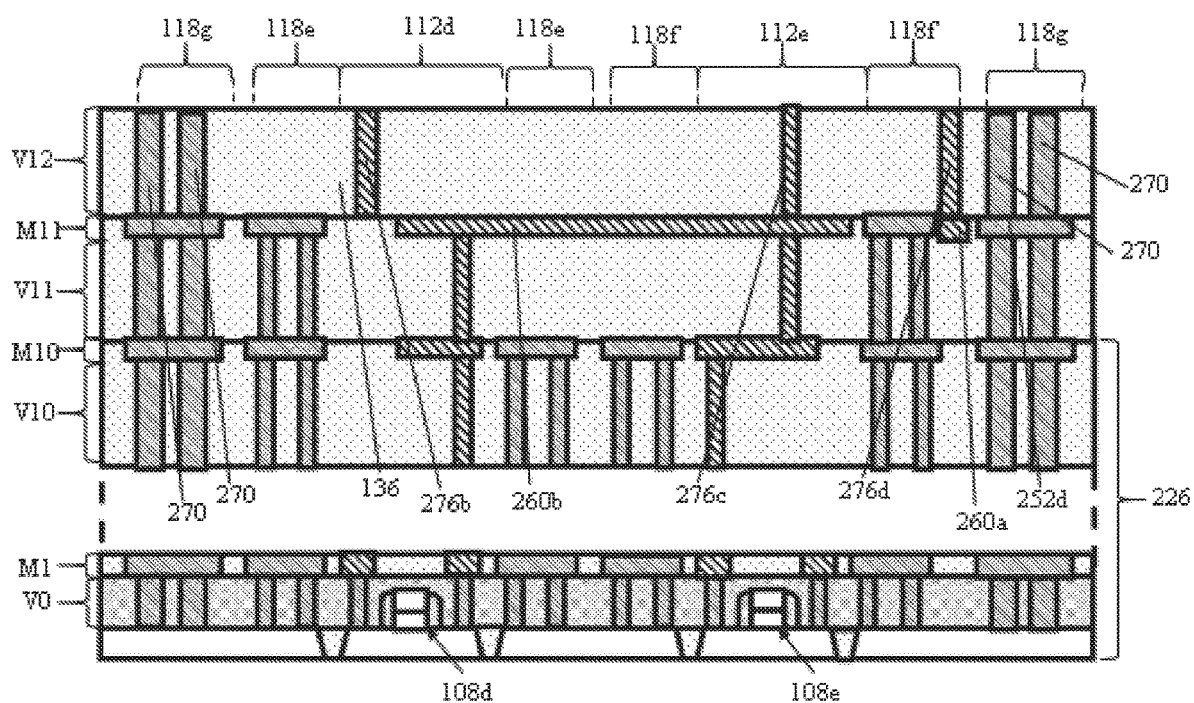
FIG. 19 shows a cross-sectional view of forming the third BEOL layer using the mask of FIG. 18 at line 19-19 of FIG. 18, according to embodiments of the disclosure.

Referring next to FIGS. 18 and 19, a third BEOL mask 268 (FIG. 18 only) for forming a third predetermined BEOL layer is shown. For example, as shown in FIG. 19, third BEOL mask 268 may be used to form via layer V12 on metal layer M11.

As shown in FIG. 18, third BEOL mask 268 may include crack-stop pattern opening 270a surrounding IC chip regions 112c,d,e (in phantom). As shown in FIG. 19, crack-stop pattern opening 270 of third BEOL mask 268 (FIG. 18) may be used to form via layer portion 272 of fourth crack-stop structure 118g within ILD 136 of via layer V12. As discussed above, fourth crack-stop structure 118g may continue to protect the structures that it surrounds, e.g., during a subsequent dicing process along lines D3.

As also shown in FIG. 18, third BEOL mask 268 may also include interconnect via pattern openings 274a,b,c,d within IC chip regions 112c,d,e (in phantom) and between IC chip regions 112c,d,e (in phantom) and crack-stop pattern opening 270. As shown in FIG. 19, interconnect via pattern openings 274a,b,c,d of third BEOL mask 268 (FIG. 18) may be used to form interconnect vias 276a(not shown),b,c,d within ILD 136 of via layer V12 for interconnecting metal wires of metal layer M11 to metal wires of other metal layers. For example, as shown in FIG. 19, interconnect via 276d may connect to interconnect wire 260a which extends through metal layer M11 to structures within in IC chip region 112c. Interconnect via 276d may, for example, allow for structures (e.g., transistor 108c of FIG. 16) within IC chip region 112c (not shown in the cross-section of FIG. 19) to be connected through via layer V12 to wires in other metal layers and subsequently to other semiconductor structures into and out of the page of FIG. 19. Interconnect vias 276a,b,c may also allow for structures within IC chip regions 112c,d,e to be electrically connected to other structures through interconnect structures into and out of the page of FIG. 19. As further shown in FIG. 18, third BEOL mask 268 may be free from via layer portion pattern openings for crack-stop structures 118d,e,f surrounding IC chip regions 112c,d,e (in phantom). As shown in FIG. 19, the absence of crack-stop structure pattern openings 118d,e,f in third BEOL mask 268 (FIG. 18) may cause via layer V12 of structure 298 to be free from portions of crack-stop structures 118d,e,f within that via layer. Forming via layer V12 without portions of crack-stop structures 118d,e,f may allow for better isolation and performance of interconnect structures formed between IC chip regions through openings in the crack-stop structures such as interconnect wire 260b of FIG. 17, formed according to embodiments of the disclosure.

Third BEOL mask 268 may be formed by any now known or later developed BEOL fabrication techniques and materials for forming a mask. Via layer V12 and the structures therein be formed using third BEOL mask 268 and any now known or later developed BEOL fabrication techniques and materials for forming a BEOL metal layer using a mask.

Figure 20:
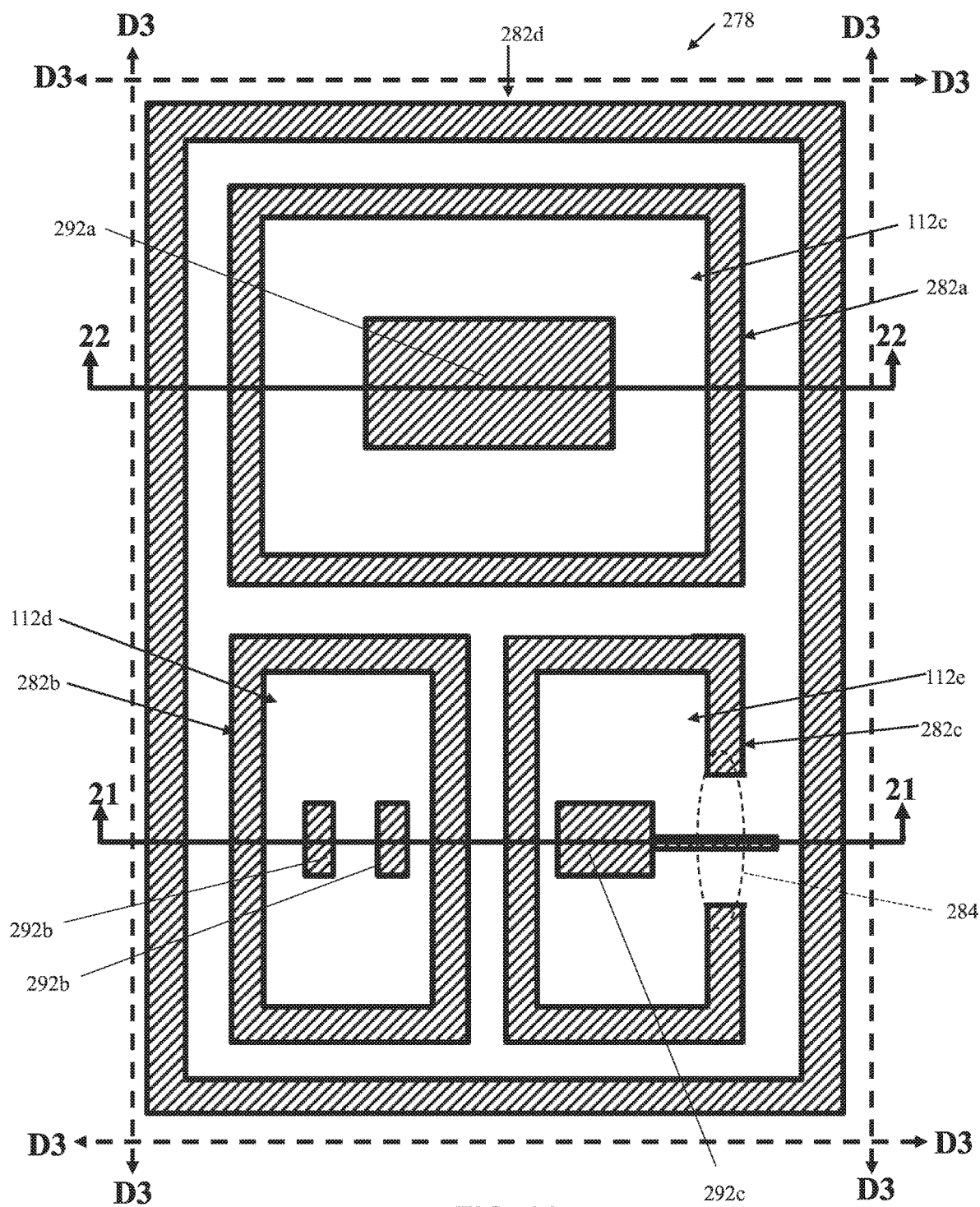
FIG. 20 shows a plan view of another mask for forming a fourth BEOL layer on the structure of FIG. 19, according to embodiments of the disclosure.
Figure 21:
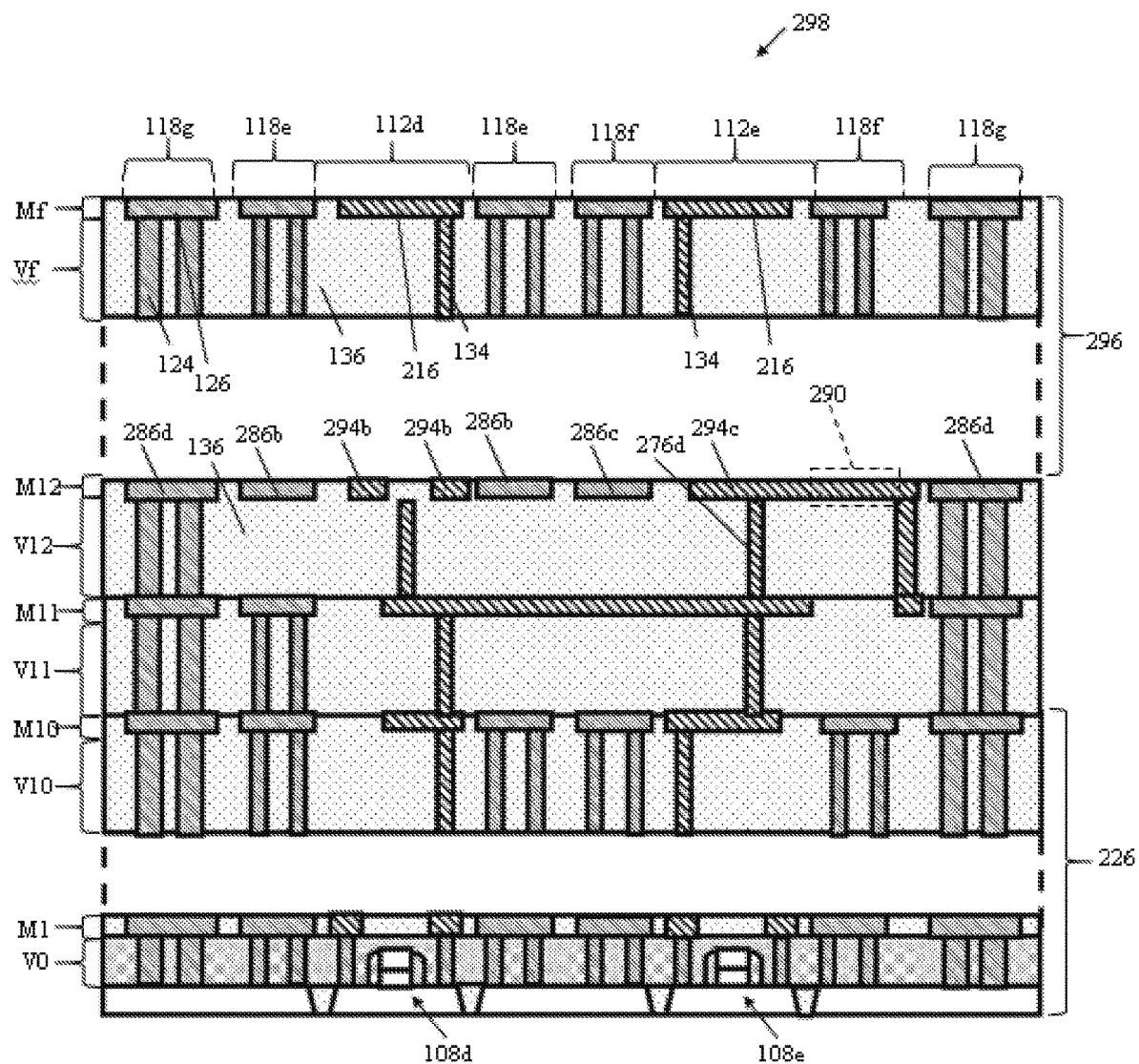
FIG. 21 shows a cross-sectional view of forming the fourth BEOL layer using the mask of FIG. 20 at line 21-21 of FIG. 20, according to embodiments of the disclosure.
Figure 22:
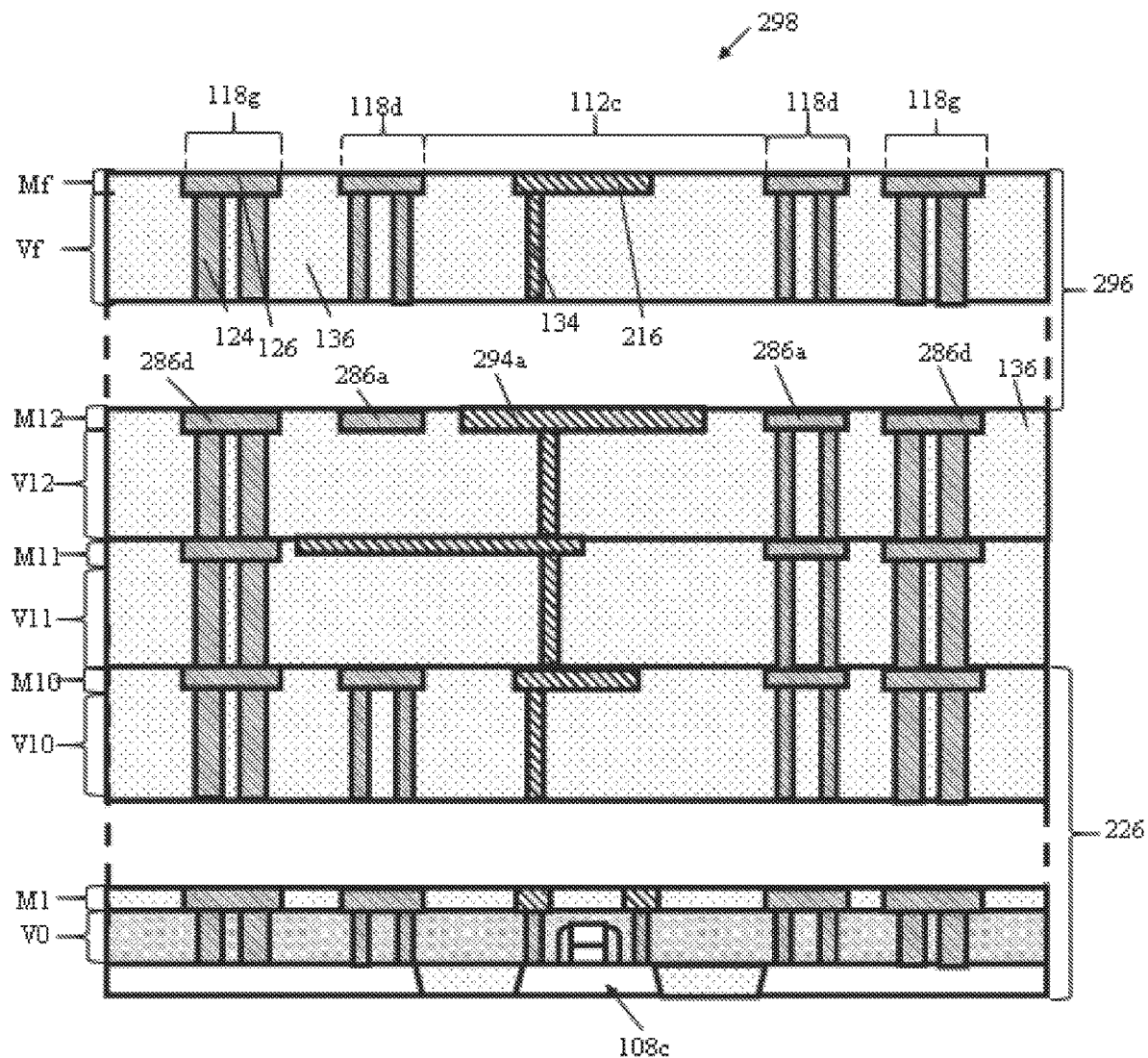
FIG. 22 shows another cross-sectional view of forming the fourth BEOL layer using the mask of FIG. 20 at line 22-22, according to embodiments of the disclosure.

Referring next to FIGS. 20-22, a fourth BEOL mask 278 for forming a fourth predetermined BEOL layer is shown. For example, fourth BEOL mask 278 may be used to form metal layer M12 on via layer V12. As shown in FIG. 20, fourth BEOL mask 278 may include crack-stop-patterns 282a,b,c surrounding IC chip regions 112c,d,e, respectively. Additionally, fourth BEOL mask 278 may include crack-stop pattern opening 282d surrounding crack-stop pattern openings 282a,b,c. In contrast to conventional BEOL masks, crack-stop pattern opening 282c may include an opening or break 284. As shown in FIG. 21, crack-stop pattern opening 282b in fourth BEOL mask 278 (FIG. 20) may be used to form a metal layer portion 286b of crack-stop structure 118e within ILD 136 of metal layer M12 surrounding IC chip region 112d. As shown in FIG. 21, crack-stop pattern opening 282b in fourth BEOL mask 278 (FIG. 20) may be used to form metal layer portion 286c of crack-stop structure 118f within ILD 136 of metal layer M12 surrounding IC chip region 112e. For example, metal layer portion 286c may extend into and out of the page of FIG. 21 to surround IC chip region 112e. Opening 284 in crack-stop pattern opening 282c of fourth BEOL mask 278 (FIG. 20) may allow for an opening 290 to be formed within metal layer portion 286c of crack-stop structure 118f. Opening 290 in wire 286c may allow for interconnect structures to be formed to extend between third IC chip region 112e and other structures outside of crack-stop structure 118f. Turning to FIG. 22, crack-stop pattern opening 282a in fourth BEOL mask 278 (FIG. 20) may be used to form metal layer portion 286a of crack-stop structure 118d within ILD 136 of metal layer M12 surrounding IC chip region 112c. For example, metal layer portion 286a may extend into and out of the page of FIG. 22 to surround IC chip region 112c. As shown in both FIGS. 21 and 22, crack-stop pattern opening 282d in fourth BEOL mask 278 (FIG. 20) may be used to form metal layer portion 286d of crack-stop structure 118g within ILD 136 of metal layer M12 surrounding crack-stop structures 118d,e,f. For example, metal layer portion 286d may extend into and out of the page of FIGS. 21 and 22 to surround crack-stop structures 118d,e,f. Crack-stop structures 118d,e,f,g may continue to protect the structures they surround from damage during processing of the BEOL structure.

As also shown in FIG. 20, fourth BEOL mask 278 may include interconnect wire pattern openings 292a,b within IC chip regions 112c,d. Fourth BEOL mask 278 may also include interconnect wire pattern opening 292c extending from within fourth IC chip region 112e and through opening 284 in crack-stop pattern opening 282c to portions of the BEOL structure outside of crack-stop pattern opening 282c. As shown in FIG. 21, interconnect wire pattern openings 292b,c in fourth BEOL mask 278 (FIG. 20) may be used to form interconnect wires 294b,c within ILD 136 of metal layer M12. For example, as shown in FIG. 21, interconnect wire 294b may be formed within IC chip region 112d, and interconnect wire 294c may be formed to extend from IC chip region 112e through opening 290 in wire 286c of crack-stop structure 118f. As also shown in FIG. 21, interconnect wire 294c may connect to interconnect via 276d in via layer V12 below and thereby interconnect structures (e.g., transistor 108c of FIG. 22) from IC chip region 112c (FIG. 22) to structures (e.g., transistor 108e) of IC chip region 112e through metal layer M11, via layer V12 and metal layer M12. As shown in FIG. 22, interconnect wire pattern opening 292a in fourth BEOL mask 278 (FIG. 20) may be used to form interconnect wire 294a within ILD 136 of metal layer M12 within first IC chip region 112c. Interconnect wire 294a may allow for semiconductor devices (e.g., transistor 108c) to be electrically connected to other semiconductor devices.

FIGS. 21 and 22 also show another example of step 3 of the method of FIG. 1, according to embodiments of the disclosure. For example, after forming the final predetermined BEOL layer metal layer M12 using fourth BEOL mask 278 (FIG. 20) at step 2b of the method (FIG. 1), a remainder 296 of the BEOL structure for a structure 298 for forming interconnected IC chips may be formed thereon. As shown in FIGS. 21 and 22, remainder 296 may include BEOL metal layers and via layers through final via layer Vf and final metal layer Mf, 'f' indicating final layer. Remainder 296 may be formed by any now known or later developed BEOL fabrication techniques. As discussed above with respect to remainder 212 (FIGS. 4, 5, 7 and 8) and as represented by the dotted lines between metal layer M12 and via layer Vf, remainder 296 may include any number of BEOL layers. For example, the number BEOL layers of remainder 296 may depend on the predetermined BEOL layers and the overall number of layers desired in the BEOL structure. Similarly to remainder 212 discussed above with respect to the examples of FIGS. 2-7, remainder 296 of the BEOL of structure for structure 298 may include additional stacked interconnect structures (e.g., interconnect vias 134 of via layer Vf) formed within ILD 136 of the metal and via layers. As further shown in FIGS. 21 and 22, remainder 296 may also include portions of crack-stop structures 118d,e,f,g extending therein. For example, final via layer Vf may include via layer crack-stop portions 124 in ILD 136, and final metal layer Mf may include metal layer crack-stop portions 126 within ILD 136. Similarly to remainder 212 of FIGS. 4, 5, 7 and 8 above, remainder 296 may further include bond pads 216 formed within final metal layer Mf for electrically connecting the structures of structure 298 (e.g., interconnect vias 134 of via layer VF) to external structures such as, for example, packaging, power sources, etc. Bond pads 216 may be formed in ILD by any now known or later developed BEOL fabrication processes for forming bond pads. For example, bond pads 216 may be formed by depositing conductive materials such as aluminum (Al) in trenches above interconnect vias 134 in the final via layer Vf therebelow. As discussed above, remainder 296 for structure 298 may be formed by any now known or later developed BEOL fabrication techniques.

Forming structure 298 using multiple BEOL masks according to embodiments of the disclosure may allow for three or more IC chip regions of varying sizes to be interconnected in any desirable layout during fabrication of the BEOL structure. For example, structures within first IC chip region 112c (e.g., transistor 108c) may be interconnected with structures within smaller IC chip region 112e (e.g., transistor 108e) through interconnect structures formed within multiple BEOL layers (e.g., metal wire 260a of FIG. 16, via 276d of FIG. 19, and metal wire 294c of FIG. 21). Forming BEOL structures according to the method (FIG. 1), may allow for adjustable and customizable chip size layouts, adjustable crack-stop layouts, etc. Further, forming BEOL structures using one or more BEOL masks to form interconnects between distinct IC chip regions and other structures external of the IC chip regions may allow for a unique and novel interconnected IC chip structures to be formed. For example, using steps 1, 2b and 3 to form an interconnected IC chip structure may improve bandwidth for communication between IC chips, reduce the need for packaging and assembly lead interconnects between IC chips, improve packaging sizes, generally improve the performance of interconnected IC chips over conventional MCMs, etc.

Returning to FIGS. 7, 21 and 22, in addition to the various methods provided herein, embodiments of the disclosure further include structures 180, 298 which include interconnect structures (e.g., interconnect wires 204 of FIG. 7, interconnect wires 294, 260a of FIG. 21 and interconnect via 276d of FIG. 21) in a BEOL structure extending through openings (e.g., openings 196a,b of FIG. 7, opening 290 of FIG. 21, and opening 254a of FIG. 16) in crack-stop structures to interconnect structures within IC chip to other structures outside of those IC chip regions. Structures 180, 298 may include interconnects in the BEOL structure for interconnecting IC chip regions instead of in packaging and assembly structures. Structures 180, 298 may be processed to form interconnected IC chips including IC chips attached and interconnected to one another on the BEOL structure level. Embodiments of the disclosure may allow for interconnected IC chips including improved performance of the IC chips, improved bandwidth for communication between IC chips, improved size and layout, increased customizability, etc.

One challenge associated with interconnected IC chips having IC chips interconnected during BEOL processing includes reduced yield as a result of either both or one IC chip being inoperable. Conventional IC packaging may include interconnect layouts for connecting either single IC chips or completely operable interconnect IC chips structures. As used herein "inoperable IC chip" may include an IC chip that cannot be used in an IC device, for example, due to electrical damage, physical damage, etc.

Figure 23:
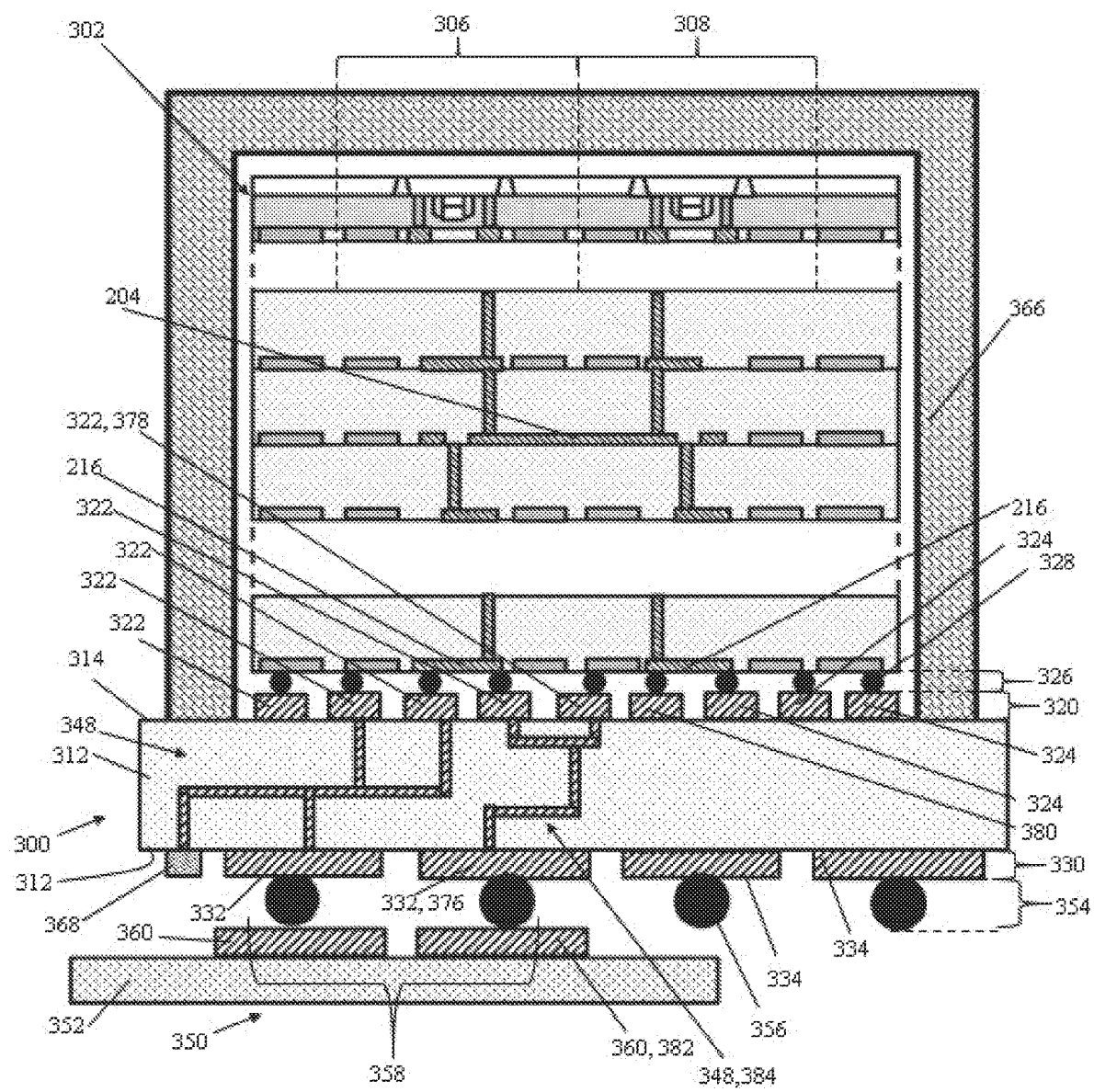
FIG. 23 shows a cross-sectional view of a packaging structure, according to embodiments of the disclosure.

Turning to FIG. 23, a flip-chip ball-grid-array (FCBGA) package 300 for utilizing interconnected IC chips having at least on inoperable IC chip and at least one operable IC chip is shown, according to embodiments of the disclosure. In the example of FIG. 23, an interconnected IC chips 302 formed from structure 180 of FIG. 7 after dicing along lines D2 is shown as connected to FCBGA package 300. For example, interconnected IC chips 302 may include an operable IC chip 306 electrically connected to an inoperable IC chip 308 by interconnect wire 204. In contrast to conventional packaging process where interconnected IC chips 302 may be discarded due to inoperable IC chip 308, FCBGA package 300 may allow for operable IC chip 306 to be utilized as a single chip module (SCM), despite being electrically and physically connected to inoperable IC 308.

As shown in FIG. 23, FCBGA package 300 may include a packaging substrate 312 having a top surface 314 and a bottom surface 316 upon which bond pads for packaging bond pad arrays may be formed. Packaging substrate 312 may be formed by any now known or later developed IC package fabrication techniques and materials for forming a packaging substrate. For example, packaging substrate 312 may include a ceramic. Packaging substrate 312 may include any desirable dimension for connecting interconnected IC chips to a printed circuit board (PCB) for a single IC chip device. For example, top surface 314 may be greater than an area defined by a length and width of at least two interconnected IC chips, e.g., greater than 50 millimeters (mm) by approximately 60 mm.

As also shown in FIG. 23, a first bond pad array 320 may be formed on top surface 314 of packaging substrate 312. First bond pad array 320 may be substantially centered on top surface 314 of packaging substrate 312 to allow for interconnected IC chips 302 to be substantially centered on top surface 314 of packaging substrate 312 for stability. First bond pad array 320 may include a set of operable bond pads 322 for electrically connecting operable IC chip 306 of interconnected IC chips 302 to FCBGA package 300. First bond pad array 320 may also optionally include a set of structural support bond pads 324 for connecting inoperable IC chip 308 of interconnected IC chips 302 to FCBGA package 300. Structural support bond pads 324 and the solder balls subsequently formed thereon may provide support for inoperable chip 308 to reduce stress in the interconnected IC chip die and prevent cracking thereof. As also shown in FIG. 23, structural support bond pads 324 may include electrical opens, i.e., they're not electrically connected to anything else, and may provide mechanical support for inoperable IC chip 308. Although not shown, structural support bond pads 324 may alternatively be connected to a power or ground. First bond pad array 320 including operable bond pads 322 and structural support bond pads 324 may be formed on top surface 314 of packaging substrate 312 by any now known or later developed IC package fabrication techniques and materials for forming bond pads on a packaging substrate. For example, bond pads 325 may be formed by patterned deposition of aluminum. Although nine bond pads (e.g., four operable, one optional ground and three structural support) are shown in the example of FIG. 23, it should be understood that first bond pad array 320 may include any number of operable and/or structural support bond pads for connecting interconnected IC chips having at least one operable and at least on inoperable IC chip to a FCBGA package.

As shown in FIG. 23, interconnected IC chips 302 including operable IC chip 306 and inoperable IC chip 308 may be connected to first bond pad array 320 by a controlled collapse chip connect (C4) array 326. As used herein, the term "C4 array" may include interconnect structures for electrically connecting bond pads of an IC chip to bond pads on a packing substrate. For example, C4 array 326 may include an array of solder balls 328 connecting bond pads 216 of operable IC chip 306 to operable bond pads 322 of first bond pad array 320, and bond pads 216 of inoperable IC chip 308 to structural support bond pads 324 of first bond pad array 320. Solder balls 328 of C4 array 326 may be formed on first bond pad array 320 by any now known or later developed IC package fabrication techniques and materials for forming a C4 array. For example, solder balls 328 may be formed by electroplating tin silver (SnAg). Interconnected IC chips 302 may be connected to C4 array 326 such that corresponding bond pads 216 of the IC chips of interconnected IC chips 302 are connected to the appropriate corresponding operable bond pads 322 or structural support bond pads 324 of first bond pad array 320.

As also shown in FIG. 23, a second bond pad array 330 may be formed on bottom surface 316 of packaging substrate 312. Second bond pad array 330 may include a set of operable bond pads 332 for electrically connecting operable IC chip 306 of interconnected IC chips 302 to a conventional printed circuit board (PCB) 350 for a single IC chip device. For example, as shown in FIG. 23, operable bond pads 332 of second bond pad array 330 may be electrically connected to operable bond pads 322 of first bond pad array 320 through an interconnect structure 348 in packaging substrate 312. As also shown in FIG. 23, in contrast to conventional FCBGA packages, operable bond pads 332 of second bond pad array 330 may be substantially centered with operable IC chip 306 and off-center with respect to packaging substrate 312. Second bond pad array 330 may also optionally include a set of structural support bond pads 334. Where included, structural support bond pads 334 may provide support for larger PCBs and/or may allow for ease of manufacture of second bond pad array 330. For example, if a PCB that is larger than PCB 350 is used, the PCB may extend over structural support bond pads 334. The structural support bond pads and the solder balls subsequently formed thereon may support the larger PCB to reduce stress therein and to prevent cracking. Alternatively, in the example shown in FIG. 23 where PCB 350 only extends over a portion of second bond pad array 330, structural support bond pads 334 may allow for ease of manufacture and balance of the second bond pad array 330 on bottom surface 316 of packaging substrate 312. As also shown in FIG. 23, structural support bond pads 334 of second bond pad array 330 may include electrical opens and may provide mechanical support for FCBGA package 300. For example, structural support bond pads 334 may provide balance on bottom surface 312 of packaging substrate 312 by being formed where operable bond pads 332 are not required. Although not shown, structural support bond pads 324 may alternatively be connected to a power or ground. Second bond pad array 330 including operable bond pads 332 and structural support bond pads 334 may be formed on bottom surface 316 of packaging substrate 312 by any now known or later developed IC package fabrication techniques and materials for forming bond pads on a packaging substrate. For example, bond pads 334 may be formed by patterned deposition of aluminum. Although four bond pads (e.g., two operable and two structural support) are shown in the example of FIG. 23, it should be understood that second bond pad array 330 may include any number of operable and/or structural support bond pads for connecting interconnected IC chips having at least one operable and at least on inoperable IC chip to a FCBGA package.

As discussed above, operable bond pads 332 of second bond pad array 330 may be electrically connected to operable bond pads 322 of first bond pad array 320 through interconnect structure 348 within packaging substrate 312. Interconnect structure 348 may allow for operable IC chip 306 to be electrically connected to operable bond pads 332 of second bond pad array 330 such that operable IC chip 306 may be electrically connected to conventional PCB 350 for a single IC chip device. Interconnect structure 348 may be formed within packaging substrate 312 by any now known or later developed IC package fabrication techniques and materials for forming an interconnect structure within a substrate. For example, interconnect structure 348 may be formed by any now known or later developed lithography and deposition techniques for forming metal (e.g., copper) wires and vias within substrate 312.

As discussed above, operable bond pads 332 of second bond pad array 330 may allow for FCBGA package 300 and therefore operable IC chip 306 to be electrically connected to PCB 350 for a single IC chip device. PCB 350 may include a PCB substrate 352, and a bond pad array 360 positioned on the substrate. PCB 350 may be formed by any now known or later developed IC package fabrication techniques and materials for forming a PCB for a single IC chip device. As further shown in FIG. 23 operable bond pads 332 of second bond pad array 330 may be electrically connected to PCB 350 by a ball grid array (BGA) 354. As used herein, the term "BGA" may include interconnect structures for electrically connecting bond pads on a packaging substrate to bond pads of a PCB. For example, BGA 354 may include an array of solder balls 356 a portion 358 of which connect operable bond pads 332 of second bond pad array 330 to bond pads 360 of PCB 350. The remainder of solder balls 356 connected, for example, to structure support bond pads 334 of second bond pad array 330 may provide mechanical support and balance for FCBGA 300. For example, structural support bond pads may improve the structural integrity of the assembled IC chip package. Solder balls 356 of BGA 354 may be formed on second bond pad array 330 by any now known or later developed IC package fabrication techniques and materials for forming a BGA. For example, solder balls 356 may be formed by electroplating of tin silver (SnAg). PCB 350 may be connected to BGA 354 such that the appropriate corresponding bond pads 216 of operable IC chip 306 of interconnected IC chips 302 are connected to corresponding operable bond pads 322 of first bond pad array 320. Although PCB 350 is shown as including two bond pads 360, it is understood that PCB may include any desirable number of bond pads for connecting FCBGA 300 to a single IC chip device (not shown).

As further shown in FIG. 23, FCBGA packaging 300 may further include a lid structure 366 for protecting interconnected IC chips 302 interconnected to first bond pad array 320 of FCBGA package 300. Lid structure 366 may be attached to top surface 314 of packaging substrate 312. For example, lid structure 366 interconnected IC chips be attached along the perimeter of the packaging substrate, surrounding and encapsulating interconnected IC chips 302, first bond pad array 320, and C4 array 326. Lid structure 366 may be attached to packaging substrate 312 by any now known or later developed packaging techniques for attaching a lid to a FCBGA package. For example, lid structure 336 may be attached to packaging substrate 312 by adhesive and/or thermal interface material (TIM). Lid structure 366 may be formed by any now known or later developed IC package fabrication techniques and materials for a FCBGA lid. For example, lid structure 366 may include Aluminum (Al).

FCBGA package 300 may optionally include an indicator 368 electrically connected to operable IC chip 306 to indicate that the IC chip is operable. The indicator may also indicate that operable IC chip 306 is interconnected with at least one other IC chip, and whether any of those interconnected IC chip(s) are operable. Indicator 368 may, for example, allow for the printed circuit board (PCB) to which the interconnected IC chips are connected to determine the number of IC chips interconnected to one another, and which of those IC chip(s) is/are operable. For example, as shown in FIG. 23, indicator 368 may be electrically connected to operable IC chip 306 through interconnect structure 348. Although shown positioned on bottom surface 326 of packaging substrate 312, it is understood that indicator 368 may be positioned anywhere on FCBGA package 300. Indicator 368 may include a light emitting diode (LED), a logical pin setting, a fuse setting and/or any other any now known or later developed mechanism for indicating the operability of an IC chip. Indicator 368 may be formed on FCBGA packaging 300 by any now known or later developed IC package fabrication techniques and materials.

FCBGA package 300 may also optionally include one of operable bond pads 332 of second bond pad array 330 acting as a dual ground pin 376 for grounding operable IC chip 306 and inoperable IC chip 308 together. For example, as shown in FIG. 23, operable bond pads 322 of first bond pad array 320 may include a first ground bond pad 378 connected the ground of inoperable IC chip 308 of interconnected IC chips 302, and a second, optional ground bond pad 380 connected to the ground of operable IC chip 306. In the example where FCBGA does not include a dual ground pin 376, second, optional ground bond pad 380 may be another structural support bond pad 324 of first bond pad array 320. First ground bond pad 378 and second, optional ground bond pad 380 of first bond pad array 320 may be connected to dual ground pin 376 of second bond pad array 330 by a portion 384 of interconnect structure 348. Dual ground pin 376 may be positioned, for example, to connect to a corresponding bonding pad 382 of conventional single IC chip device PCB 350 for grounding operable IC chip 306 and inoperable IC chip 308.

FCBGA package 300 may allow for interconnected IC chips having at least one operable IC chip and at least one inoperable IC chip to be packaged and connected to a PCB for a single IC chip device. Although shown in the example of FIG. 23 to include a flip-chip BGA package, it is understood that the BGA package may be modified to include, for example, a wire bond BGA (WBBGA). Additionally, although shown in the example of FIG. 23 to connect to interconnected IC chips having one operable chip and one inoperable chip, the bond pad arrays of the FCBGA package may be modified to connect to and utilize any interconnected IC chips having at least one inoperable IC chip and any number of operable IC chips. For example, where interconnected IC chips include two inoperable IC chips and two operable IC chips, first bond pad array 320 of FCBGA 300 may be modified to connect operable bond pads and structural support bond pads to each of the two operable IC chips and two inoperable IC chips, respectively; second bond pad array 330 may be modified to connect to a PCB for a dual IC chip device; and interconnect structure 350 may be modified to connect operable bond pads of first bond pad array 320 to operable bond pads of second bond pad array 330.

Embodiments of the present disclosure provide a packaging structure for interconnecting an operable IC chip of a multi-chip module having at least one inoperable IC chip to a printed circuit board (PCB) for a single chip device. The packaging may include a set of operable probe pads on a packaging substrate for interconnecting the operable IC chip, and a set of structural support probe pads on the packaging substrate for mechanically supporting the inoperable IC chip. Embodiments of the present disclosure may allow for repurposing of partially operable multi-chip modules and a decrease in wasted IC chips.

The method as described above is used in the fabrication of integrated circuit chips. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
   a packaging substrate including a top surface and a bottom surface;
   a first bond pad array on the top surface of the packaging substrate, the first bond pad array including:
      a set of operable bond pads, and
      a set of structural support bond pads adjacent to the set of operable bond pads,
      wherein the structural support bond pads are electrical opens;
   a second bond pad array on the bottom surface of the packaging substrate, the second bond pad array including:
      a set of operable bond pads, and
      a set of structural bond pads adjacent to the set of operable bond pads;
   an interconnected chip structure including an operable region having a first device connected to the set of operable bond pads of the first bond pad array, and an inoperable region coupled to the set of operable bond pads of the second bond pad array, wherein the operable region includes a first crack stop structure surrounding the first device, and wherein a connector wire extending through an opening of the first crack stop structure electrically couples the operable region to the inoperable region; and
   an interconnect structure positioned within the packaging substrate, wherein the interconnect structure electrically connects the set of operable bond pads of the first bond pad array to the set of operable bond pads of the second bond pad array.

2. The structure of claim 1, wherein the interconnected chip structure is substantially centered on the packaging substrate, the set of operable probe pads of the first bond pad layer is substantially centered with the operable region, and the set of operable probe pads of the second bond pad layer is substantially centered with the inoperable region.

3. The structure of claim 1, wherein the interconnected chip structure includes:
   a semiconductor substrate;
   a device region positioned on the semiconductor substrate, the device region including;
      the first device within the operable region,
      a second device within the operable region and adjacent the first device;
   a back end of line (BEOL) region positioned above the device region;
   the first crack-stop structure extending vertically through both the device region and the BEOL region, and surrounding the first device;
   a second crack-stop structure extending vertically through both the device region and the BEOL region, the second crack-stop structure surrounding the second device;
   the first opening in the first crack-stop structure within the BEOL region;
   a second opening in the second crack-stop structure within the BEOL region; and the connector wire within the BEOL region, the connector wire electrically connecting the operable region to the inoperable region through the first opening and the second opening.

4. The structure of claim 1, wherein the top surface of the packaging substrate includes a length and a width greater than a combined length and width of the operable region and the inoperable region of the interconnected chip structure.

5. The structure of claim 1, further comprising an indicator electrically coupled to the operable interconnected chip structure indicating that the operable region is operable.

6. The structure of claim 1, wherein the set of operable bond pads of the second bond pad array electrically connect the operable IC chip to a printed circuit board (PCB) of a single integrated circuit (IC) chip device.

7. The structure of claim 1, further comprising a lid structure attached to outer edges of the top surface of the packaging substrate, the lid structure encapsulating the operable region.

8. The structure of claim 1, wherein the second bond pad array includes a dual ground pin.

9. The structure of claim 1, wherein the first set of bond pads includes a flip chip ball grid array (FCBGA).

10. A structure comprising:
an interconnected chip structure including an operable integrated circuit (IC) chip and an inoperable integrated circuit (IC) chip, the operable IC chip including a set of devices each surrounded by one of a set of crack stop layers, wherein a connector wire extending through an opening of at least one of the set of crack stop layers electrically couples the operable IC chip to the inoperable IC chip;
a packaging substrate including a top surface and a bottom surface;
a first bond pad array on the top surface of the packaging substrate, the first bond pad array including:
a set of operable bond pads electrically coupled to the operable integrated circuit (IC) chip of the interconnected chip structure, and
a set of structural support bond pads adjacent to the set of operable bond pads configured to connect to the inoperable integrated circuit (IC) chip of the the interconnected chip structure, wherein the set of structural support bond pads are electrical opens;
a second bond pad array on the bottom surface of the packaging substrate, the second bond pad array including:
a set of operable bond pads configured to electrically connect the operable IC chip to a printed circuit board (PCB) for a single integrated circuit (IC) chip device, and
a set of structural support bond pads adjacent to the set of operable bond pads; and
an interconnect structure positioned within the packaging substrate, wherein the interconnect structure electrically connects the set of operable bond pads of the first bond pad array to the set of operable bond pads of the second bond pad array.

11. The structure of claim 10, wherein the set of structural support bond pads of the first bond pad array mechanically support the inoperable IC chip of the plurality of interconnected IC chips.

12. The structure of claim 11, further comprising an indicator electrically coupled to the operable IC chip indicating that the operable IC chip is operable.

13. The structure of claim 10, further comprising a dual ground pin electrically connected to a bond pad of the set of operable bond pads of the second bond pad array.

14. The structure of claim 10, wherein the set of operable bond pads of the first bond pad array is centered with the set of operable bond pads of the second bond pad array, and the first bond pad array is positioned off center on the packaging substrate.

15. A pair of interconnected IC chips, comprising:
a semiconductor substrate;
a device layer positioned on the semiconductor substrate, the device layer including;
a first set of devices for a first IC chip;
a second set of devices for a second IC chip, the second set of devices adjacent to the first set of devices;
a back end of line (BEOL) region positioned above the device layer;
a first crack-stop structure extending vertically through both the device layer and the BEOL region, the first crack-stop structure surrounding the first set of devices;
a second crack-stop structure extending vertically through both the device layer and the BEOL region, the second crack-stop structure surrounding the second set of devices;
a first opening in the first crack-stop structure within the BEOL region;
a second opening in the second crack-stop structure within the BEOL region; and
a connector wire within the BEOL region, the connector wire electrically connecting the first IC chip to the second IC chip through the first opening and the second opening.

16. The pair of interconnected IC chips of claim 15, wherein the first IC chip is larger than the second IC chip.

17. The pair of interconnected IC chips of claim 15, wherein the first opening is in a same level of the pair of interconnected IC chips as the second opening.

18. The pair of interconnected IC chips of claim 15, wherein the first opening is horizontally aligned with and faces the second opening.

19. The pair of interconnected IC chips of claim 15, further comprising a third crack-stop structure surrounding the first crack-stop structure and the second crack-stop structure, the third crack-stop structure extending vertically through both the device layer, and the BEOL region.

\* \* \* \* \*